(12) United States Patent
Yuuki

(10) Patent No.: US 12,359,119 B2
(45) Date of Patent: Jul. 15, 2025

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventor: Miyazaki Yuuki, Tsurumi-ku (JP)

(73) Assignee: Samsung Display Co., Ltd., Yongin-si (KR)

(\*) Notice: Subject to any disclaimer, the term of this patent is extended or adjusted under 35 U.S.C. 154(b) by 617 days.

(21) Appl. No.: 16/553,787

(22) Filed: Aug. 28, 2019

(65) Prior Publication Data

US 2020/0185626 A1    Jun. 11, 2020

(30) Foreign Application Priority Data

Dec. 10, 2018 (KR) .................. 10-2018-0158373

(51) Int. Cl.
| | | |
|---|---|---|
| *H10K 85/40* | (2023.01) | |
| *C07F 7/08* | (2006.01) | |
| *C07F 9/6584* | (2006.01) | |
| *C07F 9/6596* | (2006.01) | |
| *C09K 11/06* | (2006.01) | |
| *H10K 50/11* | (2023.01) | |

(Continued)

(52) U.S. Cl.
CPC ............ *C09K 11/06* (2013.01); *C07F 7/0812* (2013.01); *C07F 7/0816* (2013.01); *C07F 9/6584* (2013.01); *C07F 9/6596* (2013.01); *H10K 85/40* (2023.02); *H10K 85/657* (2023.02); *H10K 85/658* (2023.02); *C09K 2211/1011* (2013.01); *C09K 2211/1014* (2013.01); *C09K 2211/1018* (2013.01); *C09K 2211/1022* (2013.01); *H10K 50/11* (2023.02); *H10K 2101/10* (2023.02)

(58) Field of Classification Search
None
See application file for complete search history.

(56) References Cited

U.S. PATENT DOCUMENTS

| | | |
|---|---|---|
| 5,645,948 A | 7/1997 | Shi et al. |
| 8,436,344 B2 | 5/2013 | Seo et al. |
| 9,065,060 B2 | 6/2015 | Hong et al. |

(Continued)

FOREIGN PATENT DOCUMENTS

| | | |
|---|---|---|
| CN | 107501311 A | 12/2017 |
| CN | 107619418 A | 1/2018 |

(Continued)

OTHER PUBLICATIONS

Takashi Karatsu et al. "Blue electroluminescence of silyl substituted anthracene derivatives", Org. Electronics 2007, vol. 8, p. 357-366 (Year: 2007).*

(Continued)

*Primary Examiner* — Seokmin Jeon
(74) *Attorney, Agent, or Firm* — Womble Bond Dickinson (US) LLP

(57) ABSTRACT

An organic electroluminescence device includes: a first electrode, a hole transport region on the first electrode, an emission layer on the hole transport region, an electron transport region on the emission layer, and a second electrode on the electron transport region, wherein the emission layer includes a polycyclic compound represented by Formula 1.

16 Claims, 2 Drawing Sheets

(51) Int. Cl.
*H10K 85/60* (2023.01)
*H10K 101/10* (2023.01)

(56) References Cited

U.S. PATENT DOCUMENTS

| | | | |
|---|---|---|---|
| 9,502,672 | B2 | 11/2016 | Lin et al. |
| 9,708,262 | B2 | 7/2017 | Parham et al. |
| 10,333,085 | B2 | 6/2019 | Nakano et al. |
| 10,374,166 | B2 | 8/2019 | Hatakeyama et al. |
| 11,845,768 | B2 | 12/2023 | Hong et al. |
| 2004/0053069 | A1 | 3/2004 | Sotoyama et al. |
| 2015/0236274 | A1 | 8/2015 | Hatakeyama et al. |
| 2017/0018710 | A1 | 1/2017 | Mujica-Fernaud et al. |
| 2018/0069182 | A1* | 3/2018 | Hatakeyama ....... H01L 51/0071 |
| 2018/0094000 | A1 | 4/2018 | Hatakeyama et al. |
| 2018/0097181 | A1 | 4/2018 | Fuchiwaki |
| 2018/0114907 | A1 | 4/2018 | Takada et al. |
| 2018/0148462 | A1 | 5/2018 | Fuchiwaki |
| 2018/0301629 | A1 | 10/2018 | Hatakeyama et al. |
| 2018/0331290 | A1 | 11/2018 | Miyake et al. |
| 2019/0058124 | A1 | 2/2019 | Hatakeyama et al. |
| 2019/0207112 | A1 | 7/2019 | Hatakeyama et al. |
| 2019/0256538 | A1* | 8/2019 | Hatakeyama ......... C07F 9/6584 |
| 2020/0013961 | A1 | 1/2020 | Kim et al. |
| 2020/0058885 | A1* | 2/2020 | Hong .................. H01L 51/0094 |
| 2020/0203651 | A1* | 6/2020 | Duan .................. H01L 51/5016 |
| 2020/0203652 | A1 | 6/2020 | Duan et al. |
| 2020/0223873 | A1* | 7/2020 | Thobes .................. C07F 5/027 |
| 2020/0231604 | A1 | 7/2020 | Joly |
| 2020/0411771 | A1* | 12/2020 | Kim .................... H01L 51/0073 |
| 2022/0017545 | A1 | 1/2022 | Han et al. |
| 2023/0092585 | A1 | 3/2023 | Kim et al. |

FOREIGN PATENT DOCUMENTS

| | | |
|---|---|---|
| CN | 109411634 B | 12/2019 |
| CN | 111574544 A | 8/2020 |
| CN | 112585145 A | 3/2021 |
| CN | 113227108 A | 8/2021 |
| JP | 3915256 B2 | 5/2007 |
| JP | 4060669 B2 | 3/2008 |
| JP | 2012-234873 A | 11/2012 |
| JP | 5724588 B2 | 5/2015 |
| JP | 5935199 B2 | 6/2016 |
| JP | 6526793 B2 | 6/2019 |
| JP | 6703149 B2 | 6/2020 |
| KR | 10-0525408 B1 | 11/2005 |
| KR | 10-2006-0051622 A | 5/2006 |
| KR | 10-2010-0048447 A | 5/2010 |
| KR | 10-2012-0129922 A | 11/2012 |
| KR | 10-1233379 B1 | 2/2013 |
| KR | 10-2013-0058027 A | 6/2013 |
| KR | 10-2013-0143494 A | 12/2013 |
| KR | 10-2014-0015202 A | 2/2014 |
| KR | 10-1546215 B1 | 8/2015 |
| KR | 10-2016-0073914 A | 6/2016 |
| KR | 10-2016-0082067 A | 7/2016 |
| KR | 10-2016-0119683 A | 10/2016 |
| KR | 10-2017-0096039 A | 8/2017 |
| KR | 10-2017-0122296 A | 11/2017 |
| KR | 10-2017-0130435 A | 11/2017 |
| KR | 10-1854886 B1 | 5/2018 |
| KR | 10-2018-0062561 A | 6/2018 |
| KR | 10-1868505 B1 | 6/2018 |
| KR | 10-2018-0108604 A | 10/2018 |
| KR | 10-2053324 B1 | 12/2019 |
| WO | WO 2010/050778 A1 | 5/2010 |
| WO | WO 2012/099376 A2 | 7/2012 |
| WO | WO 2015/102118 A1 | 7/2015 |
| WO | WO 2015/131976 A1 | 9/2015 |
| WO | WO 2016/152418 A1 | 9/2016 |
| WO | WO 2016/152544 A1 | 9/2016 |
| WO | WO 2017/188111 A1 | 11/2017 |
| WO | WO 2018/020366 A1 | 2/2018 |
| WO | WO 2018/047639 A1 | 3/2018 |
| WO | 2018/186670 A1 | 10/2018 |
| WO | 2018/203666 A1 | 11/2018 |
| WO | 2019/052939 A1 | 3/2019 |
| WO | WO 2019/198698 A1 | 10/2019 |
| WO | 2020/135790 A1 | 7/2020 |
| WO | WO 2020/151499 A1 | 7/2020 |

OTHER PUBLICATIONS

Jae-Wook Kang et al. "Silane- and triazine-containing hole and exciton blocking material for high-efficiency phosphorescent organic light emitting diodes", J. Mater. Chem. 2007, vol. 17, p. 3714-3719 (Year: 2007).*
Ming-Han Tsai et al. "Highly Efficient Organic Blue Electrophosphorescent Devices Based on 3,6-Bis(triphenylsilyl)carbazole as the Host Material", Adv. Mater. 2006, vol. 18, p. 1216-1220 (Year: 2006).*
Takuji Hatakeyama et al. "Ultrapure Blue Thermally Activated Delayed Fluorescence Molecules: Efficient HOMO-LUMO Separation by the Multiple Resonance Effect", Adv. Mater. 2016, vol. 28, p. 2777-2781 (Year: 2016).*
English translation of JP 2016/219487 A, and the original JP 2016/219487 A, Mayuka Kabasawa, Dec. 22, 2016 (Year: 2016).*
English translation of JP 2012/234873 A, and the original JP 2012/234873 A, Mayuka Hikime, Nov. 29, 2012 (Year: 2012).*
Soichiro Nakatsuka et al. "Divergent Synthesis of Heteroatom-Centered 4,8,12-Triazatriangulenes", Angew. Chem. Int. Ed. 2017, vol. 56, p. 5087-5090 (Year: 2017).*
U.S. Restriction Requirement dated Nov. 1, 2022, issued in U.S. Appl. No. 16/866,785 (8 pages).
C.W. Tang, et al., "Organic electroluminescent diodes," Applied Physics Letter, vol. 51, No. 12, 913-915, Sep. 21, 1987.
Chihaya Adachi, et al., "Confinement of charge carriers and molecular excitons within 5-nm-thick emitter layer in organic electroluminescent devices with a double heterostructure," Applied Physics Letter, 57 (6), 531-533, Aug. 6, 1990.
H. Murata, et al., "Non-dispersive and air-stable electron transport in an amorphous organic semiconductor," Chemical Physics Letters 339, 161-166, May 11, 2001.
Youichi Sakamoto, et al., "Synthesis, Characterization, and Electron-Transport Property of Perfluorinated Phenylene Dendrimers," J. Am. Chem. Soc. vol. 122, No. 8, 1832-1833, (2000).
Machine English translation of WO 2020/151499 (Jul. 2020).
US Office Action dated Feb. 15, 2023, issued in U.S. Appl. No. 16/810,626 (21 pages).
US Final Office Action dated Jul. 25, 2023, issued in U.S. Appl. No. 16/810,626 (16 pages).
US Office Action dated Aug. 11, 2023, issued in U.S. Appl. No. 16/866,785 (11 pages).
Chinese Office action dated Nov. 16, 2023 issued in Chinese Patent Application No. 202010116120.3, 7 pages.
US Notice of Allowance dated Dec. 15, 2023, issued in U.S. Appl. No. 16/866,785 (8 pages).
US Office Action dated Apr. 29, 2024, issued in U.S. Appl. No. 16/810,626 (15 pages).
Kohei Matsui et al., "One-Shot Multiple Borylation toward BN-Doped Nanographenes", Journal of the American Chemical Society, 2018, 4 pages, vol. 140.
Tadashi Nozaki et al., "Synthesis of Mononitro-, Monoamino- and Monohalo-p-terphenyls, and their Solubility and Specific Gravity", Nitro-, Amino- and Halo-p-terphenyls, Nov. 1962, pp. 1783-1787, vol. 35, No. 11.
Joan Simo Padial et al., "Stabilization of 2,6-Diarylanilinum Cation by Through-Space Cation-π Interactions", The Journal of Organic Chemistry, Aug. 24, 2017, pp. 9418-9424, vol. 82.
In Seob Park et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", Advanced Functional Materials, Jun. 2018, pp. 1-12, vol. 28, 1802031.
US Office Action dated May 29, 2024, issued in U.S. Appl. No. 16/866,785 (9 pages).

(56) References Cited

OTHER PUBLICATIONS

Chinese Office Action dated Jan. 7, 2025, issued in Chinese Patent Application No. 202010445865.4 (10 pages).

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2018-0158373, filed on Dec. 10, 2018, the entire contents of which are incorporated herein by reference.

BACKGROUND

The development of an organic electroluminescence display device as an image display device is being actively conducted. Different from a liquid crystal display device, the organic electroluminescence display device is a so-called self-luminescent display device in which holes and electrons injected from a first electrode and a second electrode recombine in an emission layer, and a light emission material including an organic compound in the emission layer configured to emit light to display an image.

In the application of an organic electroluminescence device to a display device, the decrease of the driving voltage, and the increase of the emission efficiency and the life of the organic electroluminescence device are beneficial, and developments of materials for an organic electroluminescence device stably attaining the requirements are being substantially continuously conducted.

For example, recently, in order to provide an organic electroluminescence device with having high efficiency, techniques for phosphorescence emission, which uses energy in a triplet state, or delayed fluorescence emission, which uses the generating phenomenon of singlet excitons by the collision of triplet excitons (triplet-triplet annihilation, "TTA") are being developed, and development of a material for thermally activated delayed fluorescence (TADF) using a delayed fluorescence phenomenon is being conducted.

SUMMARY

The present disclosure herein relates to an organic electroluminescence device and a polycyclic compound used in the organic electroluminescence device.

For example, embodiments of the present disclosure provides an organic electroluminescence device having long lifespan and high efficiency, and a polycyclic compound used therein.

Embodiments of the present disclosure also provides an organic electroluminescence device including a material configured to emit thermally activated delayed fluorescence, and a polycyclic compound used as a material configured to emit thermally activated delayed fluorescence.

An embodiment of the present disclosure provides an organic electroluminescence device including a first electrode, a hole transport region on the first electrode, an emission layer on the hole transport region, an electron transport region on the emission layer, and a second electrode on the electron transport region, wherein the emission layer includes a polycyclic compound represented by the following Formula 1:

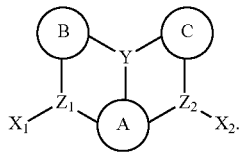

Formula 1

In Formula 1, Y is B, P, N, or P=O, in a case where Y is B or P=O, $Z_1$ and $Z_2$ are each independently N or P, in a case where Y is N or P, $Z_1$ and $Z_2$ are each independently B or P=O, ring A to ring C are each independently a substituted or unsubstituted aryl ring having 6 to 30 carbon atoms that form a ring, or a substituted or unsubstituted heteroaryl ring having 2 to 30 carbon atoms that form a ring, $X_1$ and $X_2$ are each independently a substituted or unsubstituted aryl group having 6 to 30 carbon atoms that form a ring, or a substituted or unsubstituted heteroaryl group having 2 to 30 carbon atoms that form a ring, at least one substituent bonded to at least one selected from ring A to ring C, $X_1$, and $X_2$ is —Si(Ra)$_3$ or —Si(Ra)$_2$—, and Ra is a substituted or unsubstituted aryl group having 6 to 30 carbon atoms that form a ring, or a substituted or unsubstituted heteroaryl group having 2 to 30 carbon atoms for forming a ring.

In an embodiment, the emission layer may emit delayed fluorescence.

In an embodiment, the emission layer may be a delayed fluorescence emission layer comprising a host and a dopant, and the dopant may include the polycyclic compound.

In an embodiment, the emission layer may be a thermally activated delayed fluorescence emission layer configured to emit blue light.

In Formula 1, the substituted or unsubstituted substituent selected from ring A to ring C, $X_1$, and $X_2$ may be a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or may be combined with an adjacent group to form a ring.

In an embodiment, $Z_1$ and $Z_2$ in Formula 1 may be the same.

In an embodiment, Y may be N, and $Z_1$ and $Z_2$ may be each independently B.

In an embodiment, Formula 1 may be represented by the following Formula 2:

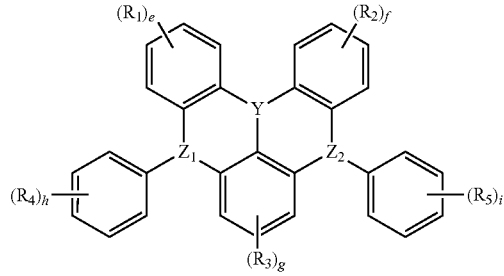

Formula 2

In Formula 2, $R_1$ to $R_5$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or combined with an adjacent group to form a ring, at least one among $R_1$ to $R_5$ is —Si(Ra)$_3$, or at least one pair among $R_1$ and $R_2$, $R_2$ and $R_5$, $R_5$ and $R_3$, $R_3$ and $R_4$, and $R_1$ and $R_4$ is —Si(Ra)$_2$—, "e" and "f" are each independently an integer of 0 to 4, "g" is an integer of 0 to 3, "h" and "i" are each independently an integer of 0 to 5, and Y, $Z_1$, $Z_2$ and Ra are the same as defined in Formula 1.

In an embodiment, Formula 2 may be represented by any one among the following Formula 2-1 to Formula 2-3:

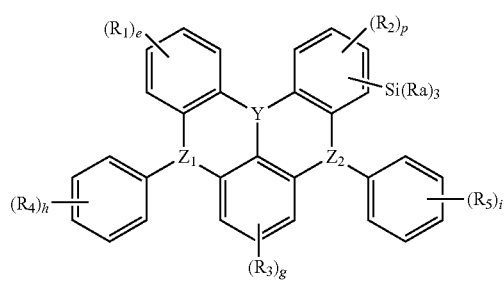

Formula 2-1

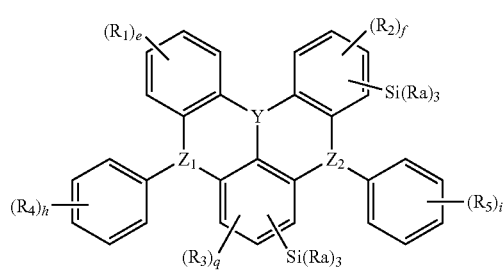

Formula 2-2

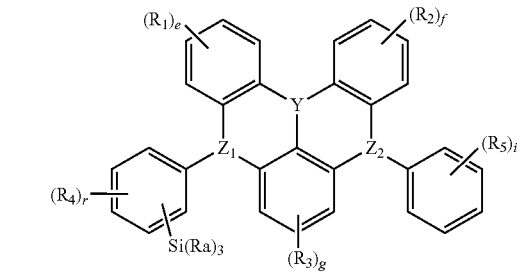

Formula 2-3

In Formula 2-1 to Formula 2-3, "p" is an integer of 0 to 3, "q" is an integer of 0 to 2, "r" is an integer of 0 to 4, and $R_1$ to $R_5$, Ra, and "e" to "i" are the same as defined in Formula 2.

In Formula 2, Y may be N.

In an embodiment, Formula 1 may be represented by the following Formula 3:

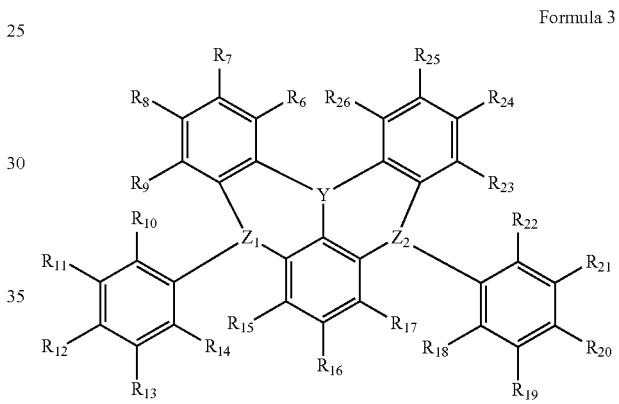

Formula 3

In Formula 3, $R_6$ to $R_{26}$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or combined with an adjacent group to form a ring, at least one among $R_6$ to $R_{26}$ is Si(Ra)$_3$, or at least one pair among $R_6$ and $R_{26}$, $R_9$ and $R_{10}$, $R_{14}$ and $R_{15}$, $R_{17}$ and $R_{18}$, and $R_{22}$ and $R_{23}$ is —Si(Ra)$_2$—, and Y, $Z_1$, $Z_2$ and Ra are the same as defined in Formula 1

In an embodiment of the present disclosure, there is provided a polycyclic compound represented by Formula 1.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
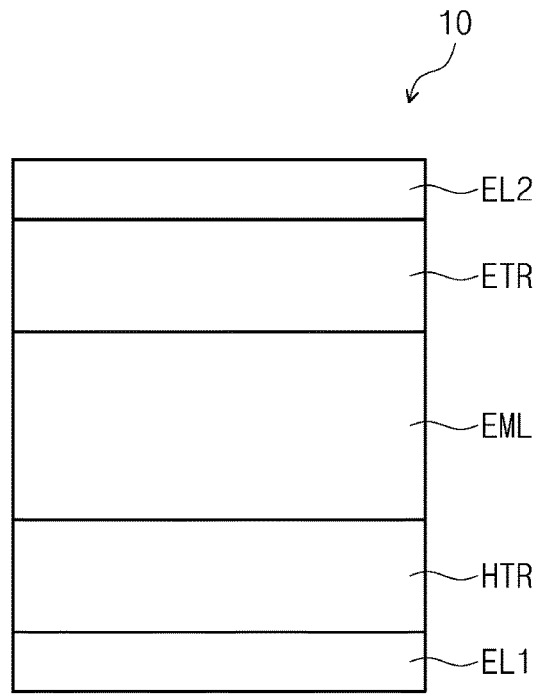
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the spirit and scope of the present disclosure. Similarly, a second element could be termed a first element. As used herein, the singular forms are intended to include the plural forms as well, unless the context clearly indicates otherwise.

It will be further understood that the terms "comprises" and/or "comprising," when used in this specification, specify the presence of stated features, numerals, acts, operations, elements, parts, or the combination thereof, but do not preclude the presence or addition of one or more other features, numerals, acts, operations, elements, parts, or the combination thereof. It will also be understood that when a layer, a film, a region, a plate, etc. is referred to as being "on" another part, it can be "directly on" the other part, or intervening layers may also be present. In addition, it will also be understood that when an element or layer is referred to as being "between" two elements or layers, it can be the only element or layer between the two elements or layers, or one or more intervening elements or layers may also be present.

Hereinafter, the organic electroluminescence device according to an embodiment of the present disclosure will be explained with reference to FIGS. 1 to 3.

Figure 2:
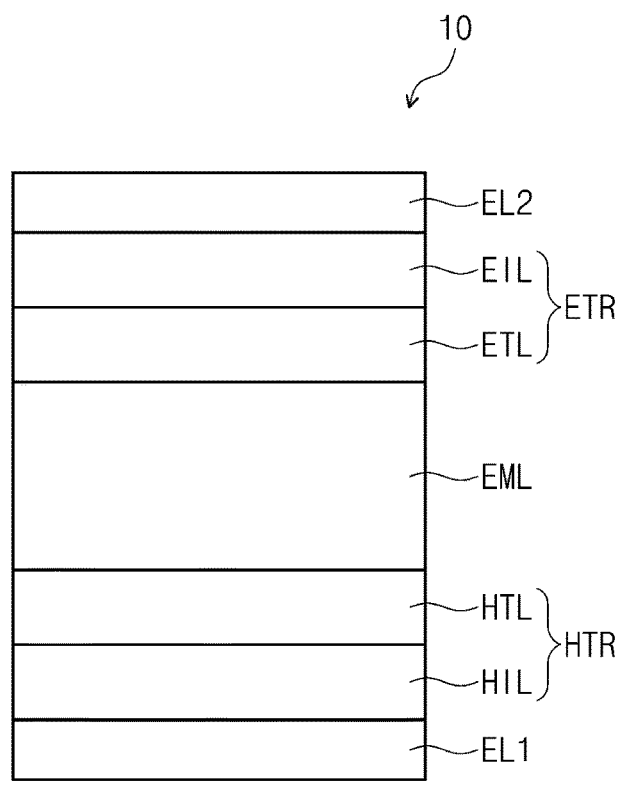
FIG. 2 is a cross-sectional view schematically illustrating an organic electroluminescence device according to an embodiment of the present disclosure.
Figure 3:
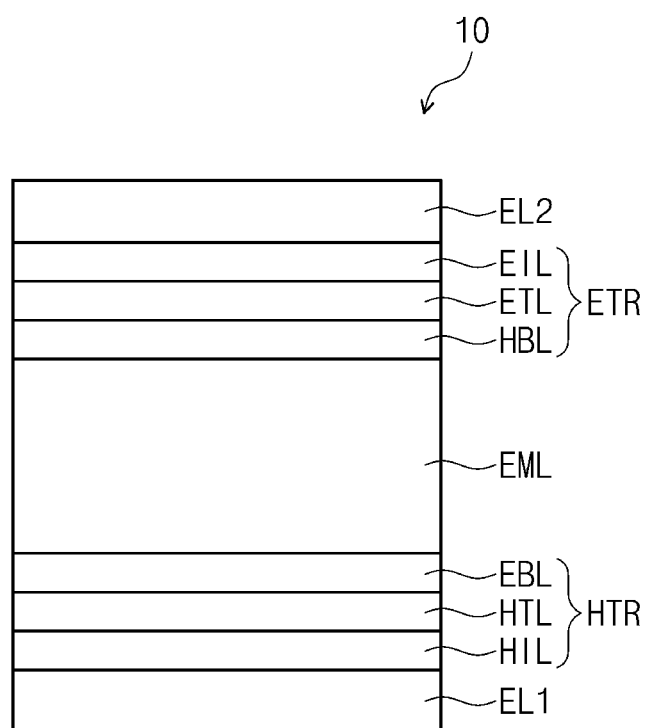
FIG. 3 is a cross-sectional view schematically illustrating an organic electroluminescence device according to an embodiment of the present disclosure.

Referring to FIGS. 1 to 3, an organic electroluminescence device 10 according to an embodiment may include a first electrode EL1, a hole transport region HTR, an emission layer EML, an electron transport region ETR and a second electrode EL2, stacked in the stated order (e.g., laminated one by one).

The first electrode EL1 and the second electrode EL2 are located opposite to each other, and a plurality of organic layers may be between the first electrode EL1 and the second electrode EL2. The plurality of the organic layers may include a hole transport region HTR, an emission layer EML, and an electron transport region ETR. The organic electroluminescence device 10 of an embodiment may include the polycyclic compound of an embodiment in the emission layer EML.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL.

In the organic electroluminescence device 10 of embodiments of the disclosure, the first electrode EL1 has conductivity (e.g., is electrically conductive). The first electrode EL1 may be formed using a metal alloy or a conductive compound. The first electrode EL1 may be, for example, an anode.

The first electrode EL1 may be a transmissive electrode, a transflective electrode, or a reflective electrode. If the first electrode EL1 is the transmissive electrode, the first electrode EL1 may be formed using a transparent metal oxide such as, for example, indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer and/or a transflective layer formed using the above materials, and a transmissive conductive layer formed using ITO, IZO, ZnO, and/or ITZO. For example, the first electrode EL1 may include a plurality of layers including ITO/Ag/ITO.

The hole transport region HTR is provided on the first electrode EL1. The hole transport region HTR may include at least one selected from a hole injection layer HIL, a hole transport layer HTL, a hole buffer layer, and an electron blocking layer EBL.

The hole transport region HTR may have a single layer formed using a single material, a single layer formed using a plurality of different materials, or a multilayer structure including a plurality of layers formed using the same or a plurality of different materials.

For example, the hole transport region HTR may have the structure of a single layer of a hole injection layer HIL, or a hole transport layer HTL, and may have a structure of a single layer formed using a hole injection material and a hole transport material. In some embodiments, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/ electron blocking layer EBL, without limitation.

The hole transport region HTR may be formed using various suitable methods such as, for example, a vacuum deposition method, a spin coating method, a cast method, a Langmuir-Blodgett (LB) method, an inkjet printing method, a laser printing method, and/or a laser induced thermal imaging (LITI) method.

The hole injection layer HIL of the organic electroluminescence device 10 of an embodiment may include any suitable hole injection material available in the art. For example, the hole injection layer HIL may include triphenylamine-containing polyetherketone (TPAPEK), 4-isopropyl-4'-methyldiphenyliodoniumtetrakis(pentafluorophenyl) borate (PPBI), N,N'-diphenyl-N, N'-bis-[4-(phenyl-m-tolyl-amino)-phenyl]-phenyl-4,4'-diamine (DNTPD), a phthalocyanine compound such as copper phthalocyanine, 4,4',4''-tris(3-methyl phenyl phenylamino)triphenylamine (m-MTDATA), N,N'-di(1-naphthyl)-N, N'-diphenylbenzidine (NPB), N,N'-bis(1-naphthyl)-N,N'-diphenyl-4,4'-diamine (a-NPD), 4,4',4''-tris {N,N-diphenylamino}triphenylamine (TDATA), 4,4',4''-tris(N,N-2-naphthyl phenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), dipyrazino[2,3-f: 2',3'-h]quinoxaline-2,3,6,7,10,11-hexacarbonitrile (HAT-CN), and/or the like. However, embodiments of the present disclosure are not limited thereto.

The hole transport layer HTL of the organic electroluminescence device 10 of an embodiment may include any suitable hole transport material available in the art. For example, the hole transport layer HTL may include 1,1-bis[(di-4-tolylamino)phenyl]cyclohexane (TAPC), carbazole derivatives such as N-phenyl carbazole and polyvinyl carbazole, N,N'-bis(3-methylphenyl)-N, N'-diphenyl-[1,1-biphenyl]-4,4'-diamine (TPD), 4,4',4''-tris(N-carbazolyl)triphenylamine (TCTA), N,N'-di(1-naphthyl)-N, N'-diphenylbenzidine (NPB), N,N'-bis(1-naphthyl)-N,N'-diphenyl-4,4'-diamine (a-NPD), and/or the like. However, embodiments of the present disclosure are not limited thereto.

Meanwhile, the hole transport region HTR may further include an electron blocking layer EBL, and the electron blocking layer EBL may be between a hole transport layer HTL and an emission layer EML. The electron blocking layer EBL may play the role of preventing or reducing electron injection from an electron transport region ETR to a hole transport region HTR.

The electron blocking layer EBL may include any suitable material known in the art. The electron blocking layer EBL may include, for example, carbazole derivatives such as N-phenylcarbazole, and/or polyvinyl carbazole, fluorine-based derivatives, N,N'-bis(3-methylphenyl)-N, N'-diphenyl-[1,1-biphenyl]-4,4'-diamine (TPD), triphenylamine-based derivatives such as 4,4',4''-tris(N-carbazolyl)triphenylamine (TCTA), N,N'-di(naphthalene-1-yl)-N,N'-diphenyl-benzidine (NPD), 4,4'-cyclohexylidene bis[N,N-bis(4-methylphenyl)benzenamine](TAPC), 4,4'-bis[N,N'-(3-tolyl)amino]-3,3'-dimethylbiphenyl (HMTPD), 1,3-di(carbazol-9-yl)benzene (mCP), and/or the like. In addition, as described above, the electron blocking layer EBL may include the polycyclic compound according to an embodiment of the present disclosure.

The thickness of the hole transport region HTR may be from about 100 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may include, for example, a p-dopant. The p-dopant may be selected from quinone derivatives, metal oxides, and cyano group-containing compounds, without limitation. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, without limitation.

As described above, the hole transport region HTR may further include at least one selected from a hole buffer layer and the electron blocking layer EBL in addition to the hole injection layer HIL and the hole transport layer HTL. The hole buffer layer may compensate for a resonance distance according to the wavelength of the light emitted from the emission layer EML and increase light emission efficiency. Materials included in the hole transport region HTR may be used as materials included in the hole buffer layer.

The emission layer EML is provided on the hole transport region HTR. The emission layer EML may have a thickness of, for example, about 100 Å to about 600 Å. The emission layer EML may have a single layer formed using a single material, a single layer formed using a plurality of different materials, or a multilayer structure having a plurality of layers formed using the same or a plurality of different materials.

The emission layer EML may emit one selected from red light, green light, blue light, white light, yellow light, and cyan light. The emission layer EML may include a fluorescence emitting material or a phosphorescence emitting material.

In an embodiment, the emission layer EML may be a fluorescence emission layer. For example, a portion of the light emitted from the emission layer EML may be attributed to thermally activated delayed fluorescence (TADF). In some embodiments, the emission layer EML may include a light-emitting component configured to emit thermally activated delayed fluorescence. In an embodiment, the emission layer EML may be an emission layer configured to emit blue light by way of thermally activated delayed fluorescence.

In the description, --* means a connecting position (e.g., location of a chemical bond).

In the present description, the term "substituted or unsubstituted" means substituted or unsubstituted with at least one substituent selected from the group consisting of a deuterium atom, a halogen atom, a cyano group, a nitro group, a hydroxyl group, an amine group, a silyl group, a boron group, a phosphine oxide group, a phosphine sulfide group, an alkyl group, an alkenyl group, an alkoxy group, an aryl group, an aryloxy group and a hetero aryl group. In addition, each of the foregoing substituents may be substituted or unsubstituted. For example, a biphenyl group may be interpreted as an aryl group or a phenyl group substituted with a phenyl group.

In the present description, the term "forming a ring via the combination with an adjacent group" may mean forming a substituted or unsubstituted hydrocarbon ring, or a substituted or unsubstituted heterocycle via a combination with an adjacent group. The term "hydrocarbon ring," as used herein, includes an aliphatic hydrocarbon ring and an aromatic hydrocarbon ring. The term "heterocycle," as used herein, includes an aliphatic heterocycle and an aromatic heterocycle. The ring formed by the combination with an adjacent group may be a monocyclic ring or a polycyclic ring. In addition, the ring formed via the combination with an adjacent group may be combined with another ring to form a spiro structure.

In the present description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, the two methyl groups may be interpreted as "adjacent groups" to each other, and in 1,1-diethylcyclopentane, the two ethyl groups may be interpreted as "adjacent groups" to each other.

In the present description, the term "halogen atom" may mean a fluorine atom, a chlorine atom, a bromine atom, or an iodine atom.

In the present description, the term "alkyl group" may refer to a linear, branched or cyclic type (or kind) of alkyl group. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present description, the term "aryl group" means an optional functional group or substituent derived from an aromatic hydrocarbon ring. The aryl group may be a monocyclic aryl group or a polycyclic aryl group. The number of carbon atoms that form a ring in the aryl group may be, 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the present description, the fluorenyl group may be substituted, and two substituents of the fluorenyl group may be combined with each other to form a spiro structure. Examples of a substituted fluorenyl group are as follows. However, embodiments of the present disclosure are not limited thereto.

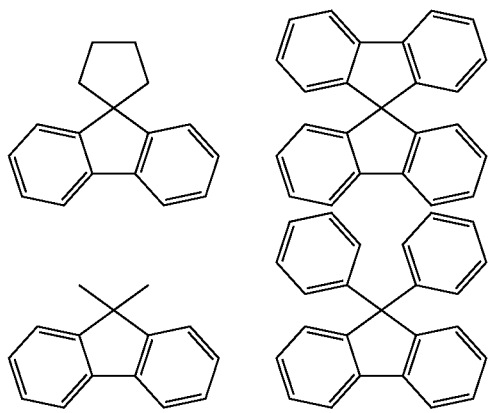

In the present description, the heteroaryl group may be a heteroaryl group including at least one selected from O, N, P, Si, and S as a heteroatom. The number of carbon atoms that forms a ring of the heteroaryl group may be 2 to 30, or 2 to 20. The heteroaryl group may be a monocyclic heteroaryl group or a polycyclic heteroaryl group. Examples of the heteroaryl group (e.g., a polycyclic heteroaryl group) may have a dicyclic or tricyclic structure. Examples of the heteroaryl may include thiophenyl, furanyl, pyrrolyl, imidazolyl, thiazolyl, oxazolyl, oxadiazolyl, triazolyl, pyridyl, bipyridyl, pyrimidyl, triazinyl, acridyl, pyridazinyl, pyrazinyl, quinolinyl, quinazolinyl, quinoxalinyl, phenoxazyl, phthalazinyl, pyrido pyrimidinyl, pyrido pyrazinyl, pyrazino pyrazinyl, isoquinolinyl, indolyl, carbazolyl, N-arylcarbazolyl, N-heteroarylcarbazolyl, N-alkylcarbazolyl, benzoxazolyl, benzoimidazolyl, benzothiazolyl, benzocarbazolyl, benzothiophenyl, dibenzothiophenyl, thienothiophenyl, benzofuranyl, phenanthrolinyl, isooxazolyl, thiadiazolyl, benzothiazolyl, phenothiazinyl, dibenzosilolyl, dibenzofuranyl, etc., without limitation.

In the present description, the silyl group includes an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc. However, embodiments of the present disclosure are not limited thereto.

In the description, the number of carbon atoms of the amine group is not specifically limited, but may be 1 to 30. The amine group may include an alkyl amine group and/or an aryl amine group. Examples of the amine group include a methylamine group, a dimethylamine group, a phenylamine group, a naphthylamine group, a 9-methyl-anthracenylamine group, a triphenylamine group, etc., without limitation.

In an embodiment, the emission layer EML includes a polycyclic compound represented by Formula 1.

Formula 1

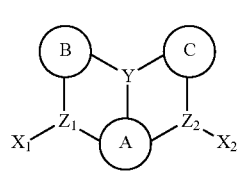

In Formula 1, Y is B, P, N, or P=O, in a case where Y is B or P=O, $Z_1$ and $Z_2$ are each independently N or P, and in a case where Y is N or P, $Z_1$ and $Z_2$ are each independently B or P=O.

In Formula 1, ring A to ring C are each independently a substituted or unsubstituted aryl ring having 6 to 30 carbon atoms that form a ring, or a substituted or unsubstituted heteroaryl ring having 2 to 30 carbon atoms that form a ring.

In Formula 1, $X_1$ and $X_2$ are each independently a substituted or unsubstituted aryl group having 6 to 30 carbon atoms that form a ring, or a substituted or unsubstituted heteroaryl group having 2 to 30 carbon atoms that form a ring.

In Formula 1, at least one substituent bonded to at least one selected from ring A to ring C, $X_1$, and $X_2$ is —$Si(Ra)_3$ or —$Si(Ra)_2$—, and Ra is a substituted or unsubstituted aryl group having 6 to 30 carbon atoms that form a ring, or a substituted or unsubstituted heteroaryl group having 2 to 30 carbon atoms that form a ring. If at least one substituent bonded to at least one selected from ring A to ring C, $X_1$, and $X_2$ is —$Si(Ra)_2$—, the substituent may be combined with an adjacent group to form a ring.

The polycyclic compound represented by Formula 1 includes an aryl silyl group or a hetero aryl silyl group, which has a large volume as a substituent (e.g., is a sterically large substituent). Although the present application is not limited by any particular mechanism or theory, it is believed that the presence of the aryl silyl group or the hetero aryl silyl group results in the following features. The coagulation (or aggregation) of a dopant may be suppressed or reduced due to the presence of the sterically large substituent. Further, the effects of the deactivation of excitons and the increase of the wavelength of emitted light due to intermolecular interaction may be prevented or reduced as a result of the presence of the aryl silyl group or the hetero aryl silyl group. In addition, due to the weak electron attracting properties of the aryl silyl group or the hetero aryl silyl group, each of which has a large volume, the electronic state of the dopant may change, thereby decreasing the wavelength of the light emitted by a device including the polycyclic compound. Further, roll-off, which is a phenomenon that degrades emission efficiency under high luminance, may be restrained or reduced, and a half width of the light emitted from a device including the polycyclic compound may decrease from about 25 nm to about 35 nm, thereby contributing to the increase of the device efficiency.

In an embodiment, in Formula 1, the substituted or unsubstituted substituent selected from ring A to ring C, $X_1$, and $X_2$ may be a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or may be combined with an adjacent group to form a ring.

In an embodiment, $Z_1$ and $Z_2$ in Formula 1 may be the same.

In an embodiment, in Formula 1, Y may be N, and $Z_1$ and $Z_2$ may be each independently B.

In an embodiment, Formula 1 may be represented by the following Formula 2:

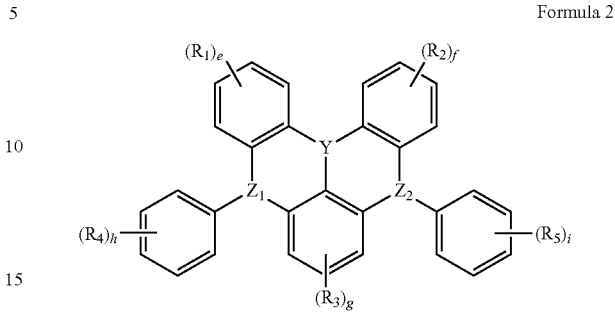

Formula 2

In Formula 2, $R_1$ to $R_5$ may be each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or may be combined with an adjacent group to form a ring.

In Formula 2, at least one among $R_1$ to $R_5$ may be —$Si(Ra)_3$, or at least one pair among $R_1$ and $R_2$, $R_2$ and $R_5$, $R_5$ and $R_3$, $R_3$ and $R_4$, and $R_1$ and $R_4$ may be —$Si(Ra)_2$—. In a case where at least one pair among $R_1$ to $R_5$ is —$Si(Ra)_2$—, a ring may be formed.

In Formula 2, "e" and "f" may be each independently an integer of 0 to 4. Meanwhile, if "e" is 2 or more, a plurality of $R_1$ groups may be the same or different, and if "f" is 2 or more, a plurality of $R_2$ groups may be the same or different.

In Formula 2, "g" is an integer of 0 to 3. Meanwhile, if "g" is 2 or more, a plurality of $R_3$ groups may be the same or different.

In Formula 2, "h" and "i" are each independently an integer of 0 to 5. Meanwhile, if "h" is 2 or more, a plurality of $R_4$ groups may be the same or different, and if "i" is 2 or more, a plurality of $R_5$ groups may be the same or different.

In Formula 2, Y, $Z_1$, $Z_2$ and Ra are the same as defined in Formula 1.

In an embodiment, Formula 2 may be represented by any one among the following Formula 2-1 to Formula 2-3:

Formula 2-1

-continued

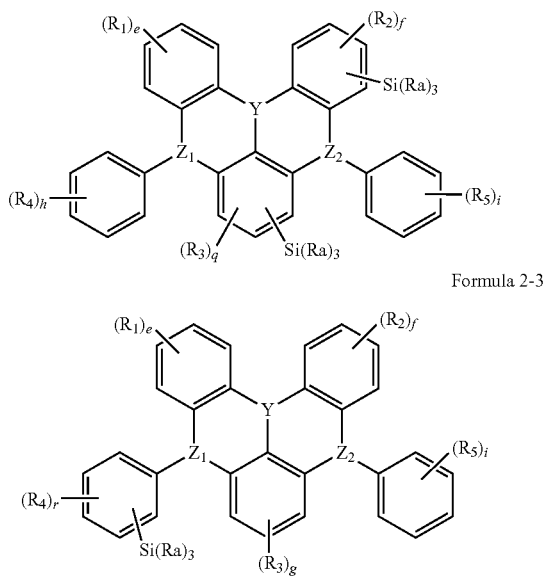

Formula 2-2

Formula 2-3

In Formula 2-1, "p" is an integer of 0 to 3. Meanwhile, if "p" is 2 or more, a plurality of $R_2$ groups are the same or different.

In Formula 2-2, "q" is an integer of 0 to 2. Meanwhile, if "q" is 2 or more, a plurality of $R_3$ groups are the same or different.

In Formula 2-3, "r" is an integer of 0 to 4. Meanwhile, if "r" is 2 or more, a plurality of $R_4$ groups are the same or different.

In Formula 2-1 to Formula 2-3, $R_1$ to $R_5$, Ra, and "e" to "i" are the same as defined in Formula 2.

In an embodiment, Y in Formula 2 may be N.

In an embodiment, $Z_1$ and $Z_2$ in Formula 2 may be the same.

In an embodiment, $Z_1$ and $Z_2$ in Formula 2 may be each independently B.

In an embodiment, Formula 1 may be represented by the following Formula 3:

Formula 3

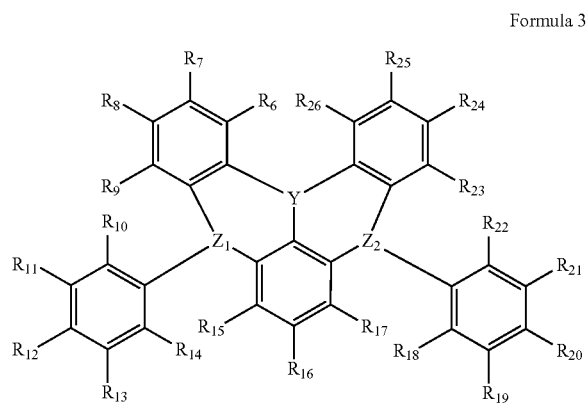

In Formula 3, $R_6$ to $R_{26}$ may be each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or may be combined with an adjacent group to form a ring.

In Formula 3, at least one among $R_6$ to $R_{26}$ may be $Si(Ra)_3$, or at least one pair among $R_6$ and $R_{26}$, $R_9$ and $R_{10}$, $R_{14}$ and $R_{15}$, $R_{17}$ and $R_{18}$, and $R_{22}$ and $R_{23}$ may be —Si$(Ra)_2$—. Meanwhile, in a case where at least one pair among $R_6$ and $R_{26}$, $R_9$ and $R_{10}$, $R_{14}$ and $R_{15}$, $R_{17}$ and $R_{18}$, and $R_{22}$ and $R_{23}$ may be —Si$(Ra)_2$—, a ring may be formed.

In Formula 3, Y, $Z_1$, $Z_2$ and Ra may be the same as defined in Formula 1.

In an embodiment, Y in Formula 3 may be N.

In an embodiment, $Z_1$ and $Z_2$ in Formula 3 may be the same.

In an embodiment, $Z_1$ and $Z_2$ in Formula 3 may be each independently B.

In an embodiment, at least one pair among $R_6$ and $R_7$, $R_7$ and $R_5$, $R_5$ and $R_9$, $R_{10}$ and $R_{11}$, $R_{11}$ and $R_{12}$, $R_{12}$ and $R_{13}$, $R_{13}$ and $R_{14}$, $R_{15}$ and $R_{16}$, $R_{16}$ and $R_{17}$, $R_{18}$ and $R_{19}$, $R_{19}$ and $R_{20}$, $R_{20}$ and $R_{21}$, $R_{21}$ and $R_{22}$, $R_{23}$ and $R_{24}$, $R_{24}$ and $R_{25}$, and $R_{25}$ and $R_{26}$, may form a condensed structure with any one among the following Formulae 3-1 to 3-4:

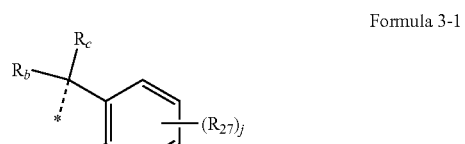

Formula 3-1

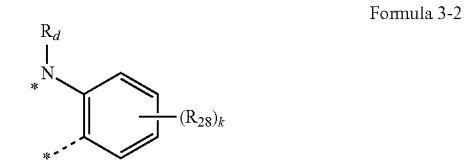

Formula 3-2

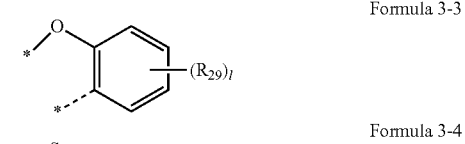

Formula 3-3

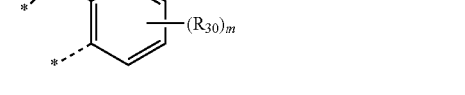

Formula 3-4

In Formulae 3-1 to 3-4, $R_{27}$ to $R_{30}$, and Rb to Ra may be each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted aryl group having 6 to 30 carbon atoms that form a ring, or a substituted or unsubstituted heteroaryl group having 2 to 30 carbon atoms that form a ring.

In Formula 3-1, "j" is an integer of 0 to 4. Meanwhile, if "j" is 2 or more, a plurality of $R_{27}$ groups are the same or different.

In Formula 3-2, "k" is an integer of 0 to 4. Meanwhile, if "k" is 2 or more, a plurality of $R_{28}$ groups are the same or different.

In Formula 3-3, "l" is an integer of 0 to 4. Meanwhile, if "l" is 2 or more, a plurality of $R_{29}$ groups are the same or different.

In Formula 3-4, "m" is an integer of 0 to 4. Meanwhile, if "m" is 2 or more, a plurality of $R_{30}$ groups are the same or different.

In an embodiment, at least one among $R_6$ to $R_9$, $R_{10}$ to $R_{14}$, and $R_{15}$ to $R_{17}$ in Formula 3 may be $Si(Ra)_3$.

The polycyclic compound of an embodiment, represented by Formula 1 may be a material configured to emit delayed fluorescence. The polycyclic compound of an embodiment may be a material configured to provide thermally activated delayed fluorescence. For example, the polycyclic compound represented by Formula 1 may be used as a blue emitting material configured to emit thermally activated delayed fluorescence. However, embodiments of the present disclosure are not limited thereto. The polycyclic compound of an embodiment may be used as a material for thermally activated delayed fluorescence, which emits green light or red light.

The compound represented by Formula 1 may be any one among the compounds represented in the following Compound Group 1:

Compound Group 1

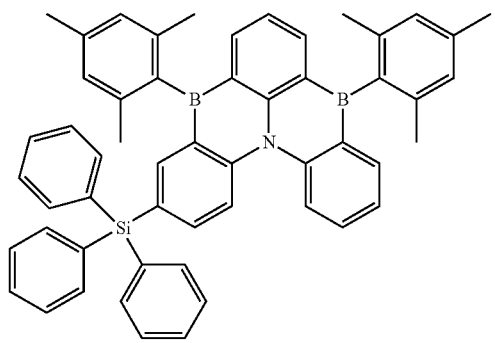

1

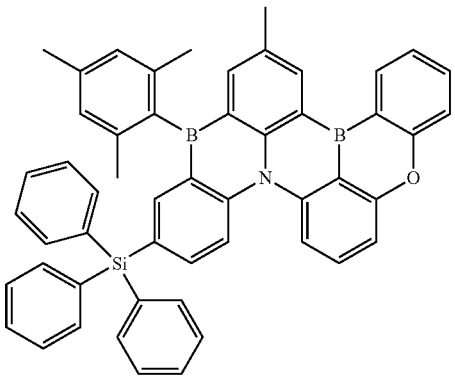

2

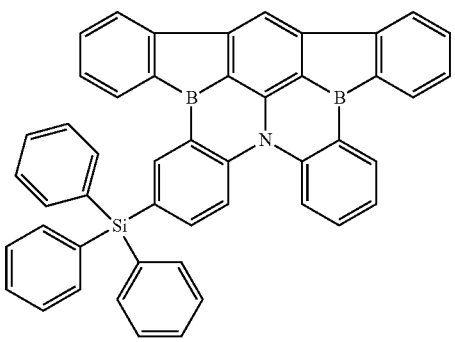

3

-continued

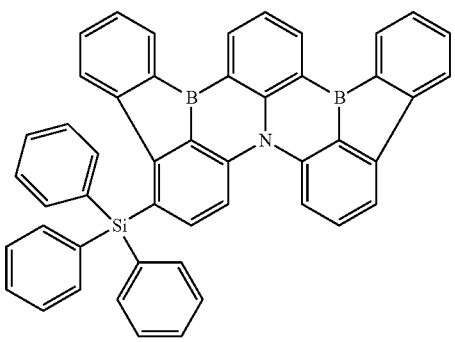

4

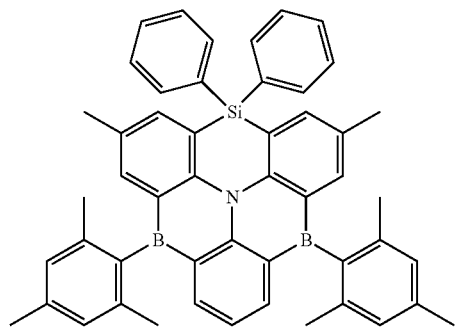

5

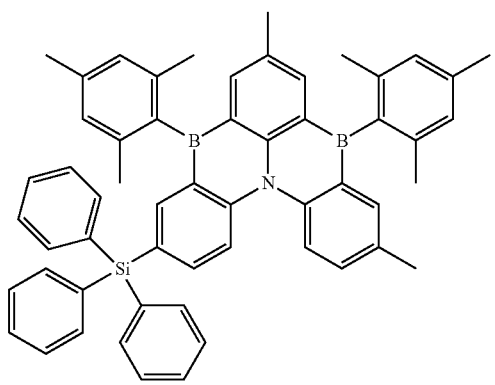 [SMILES: Cc1cc(C)c(B2c3cc(C)ccc3N3c4ccc([Si](c5ccccc5)(c5ccccc5)c5ccccc5)cc4B(c4c(C)cc(C)cc4C)c4cc(C)cc2c43)c(C)c1]

6

7
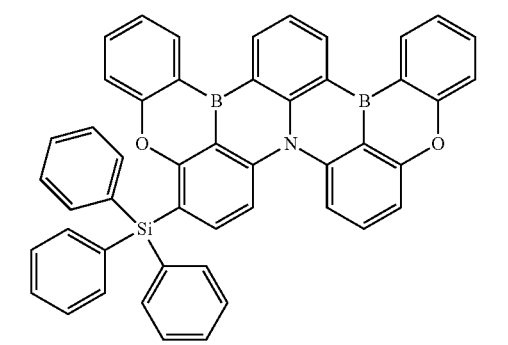
8
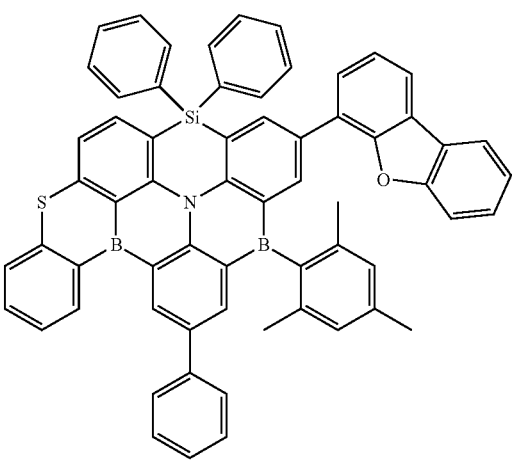
9
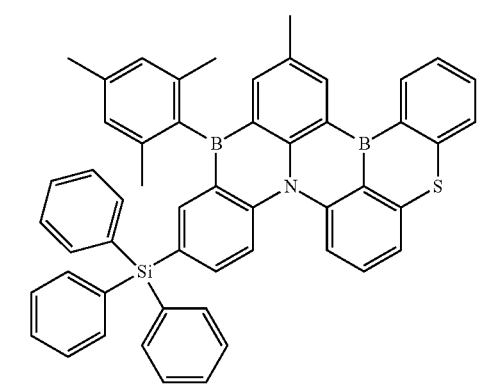
10
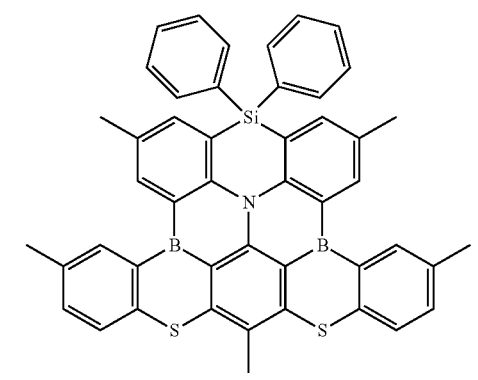
11
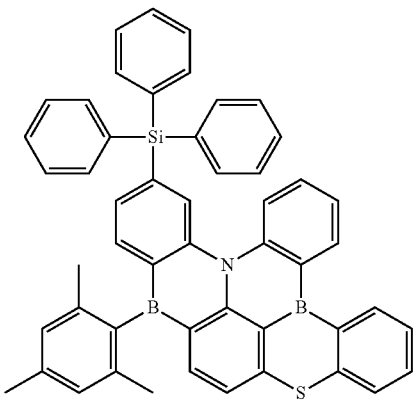
12
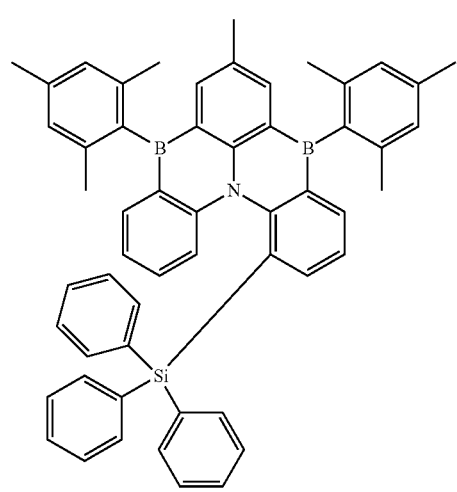
13
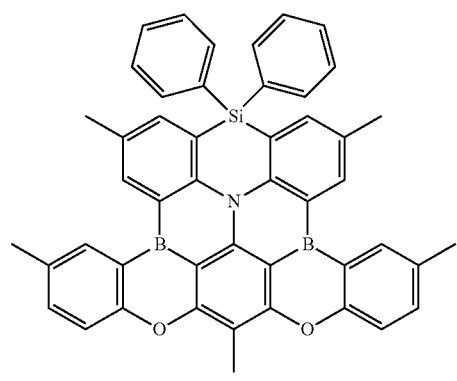

-continued
14
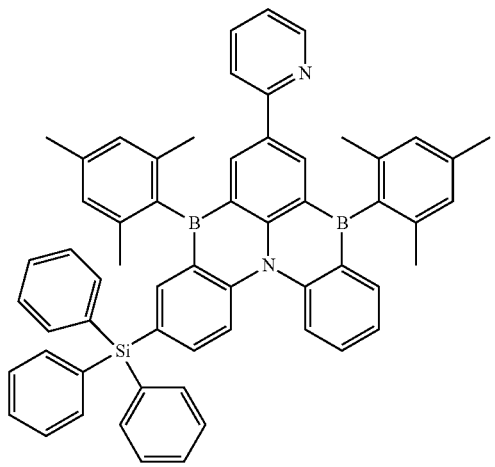
15
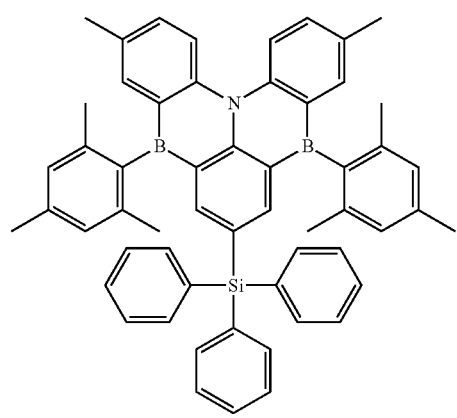
16
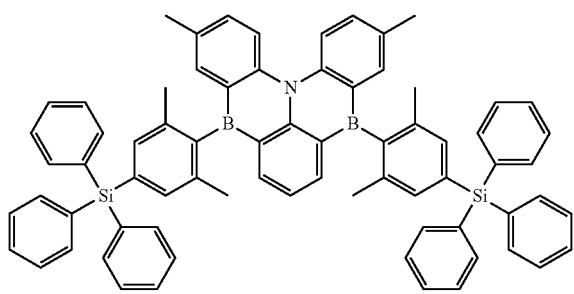
-continued
17
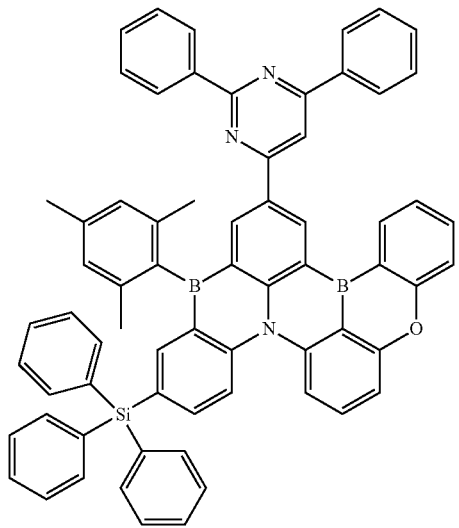
18
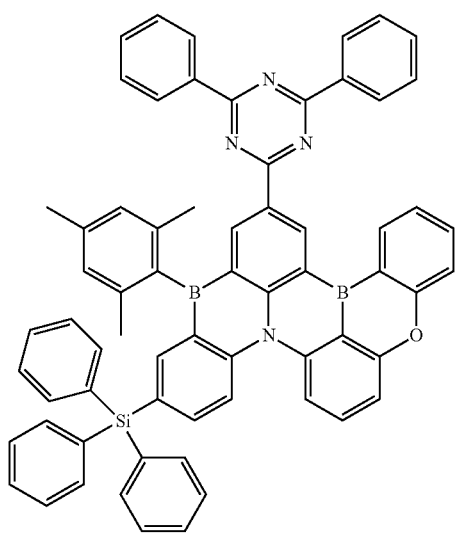
19
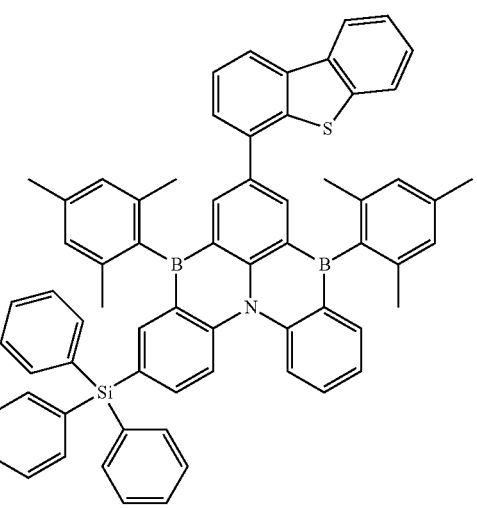

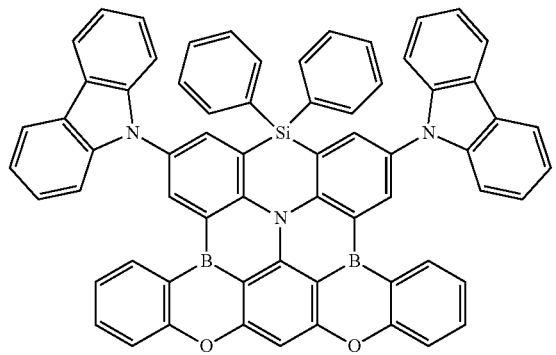
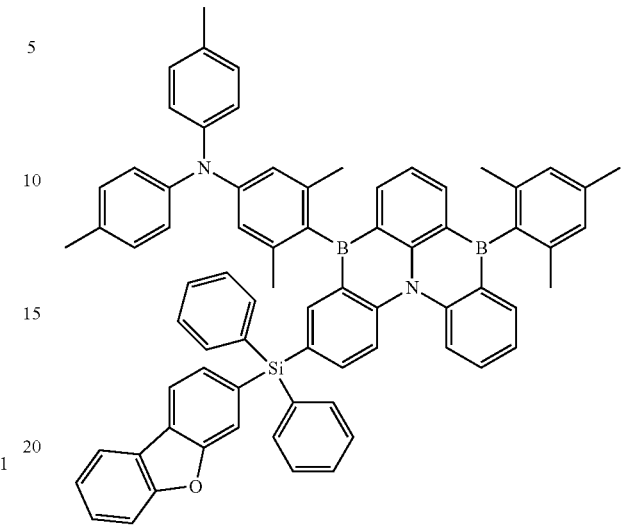
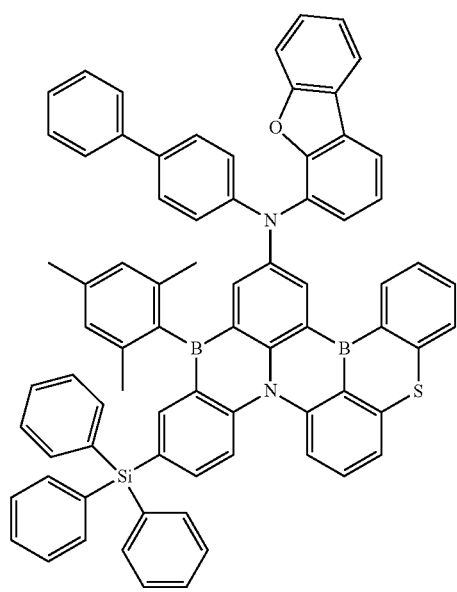
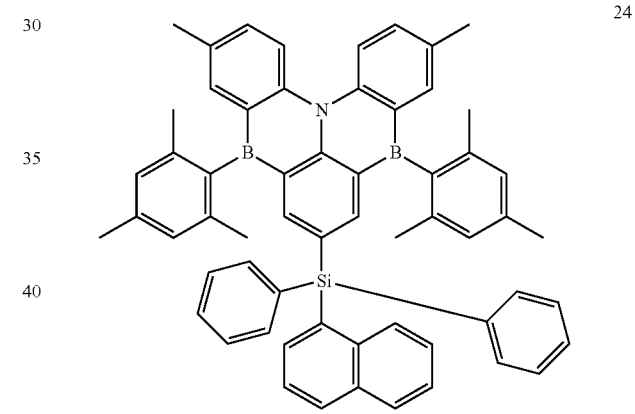
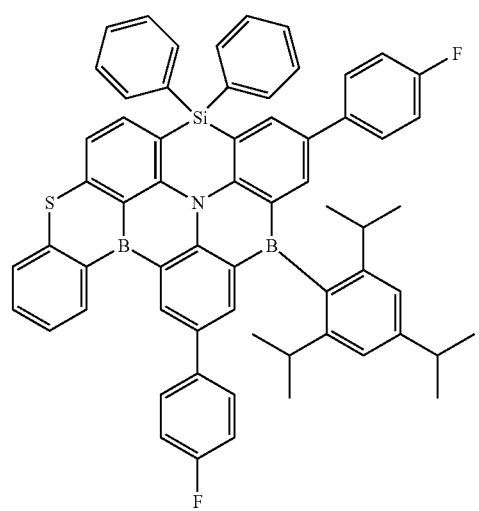

26
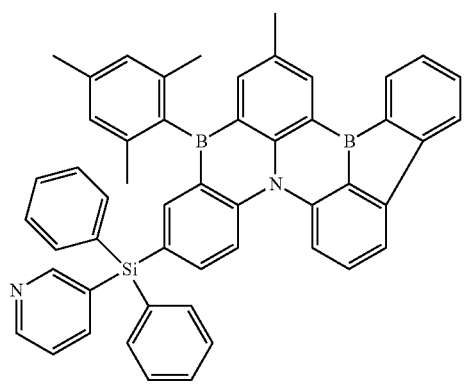
27
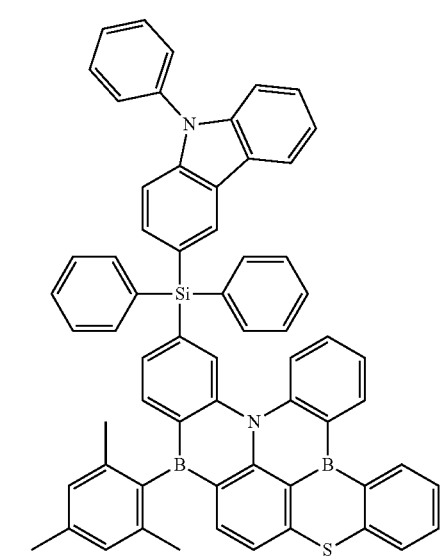
28
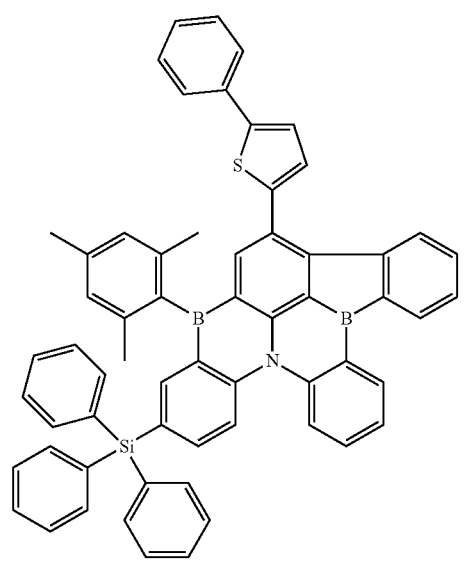
29
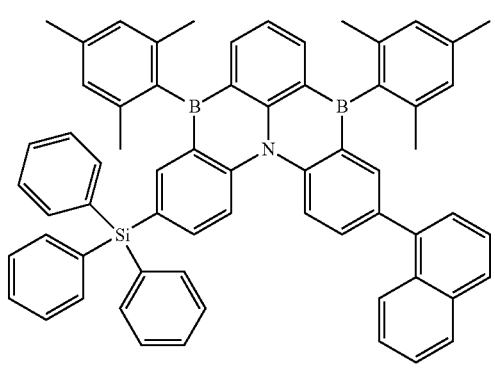
30
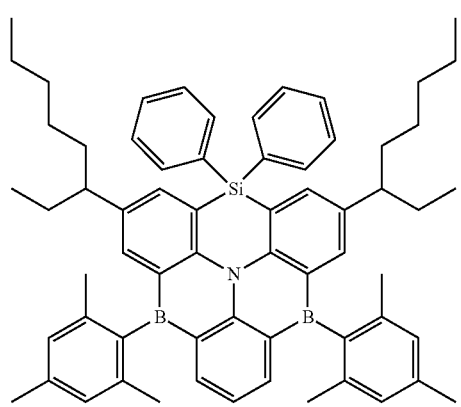
31
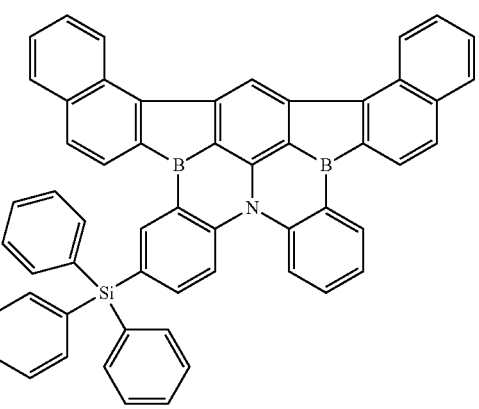
32
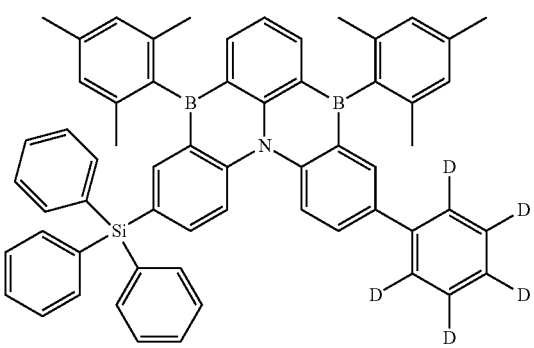

33
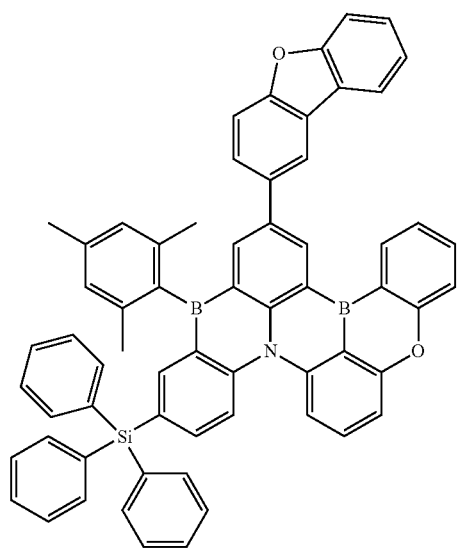
34
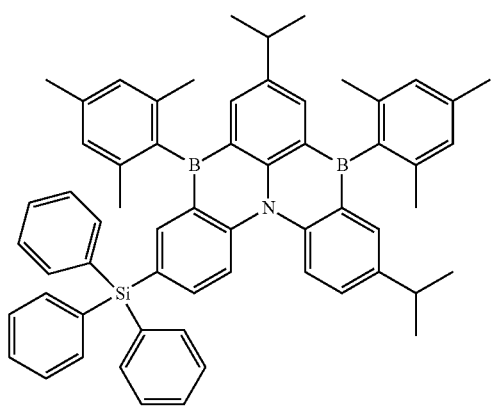
35
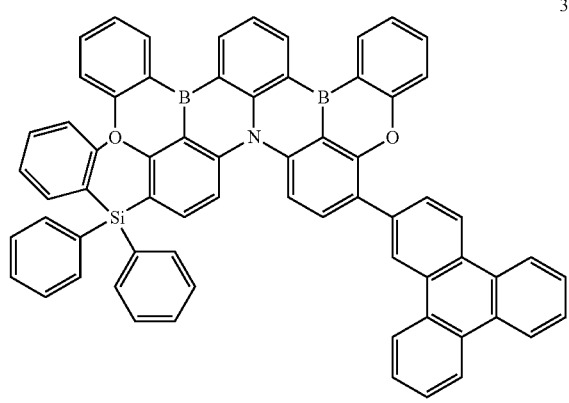
36
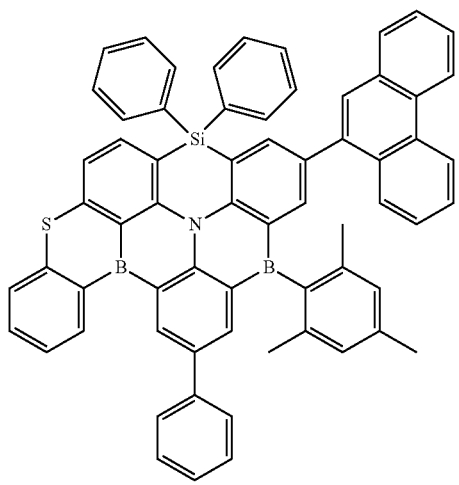
37
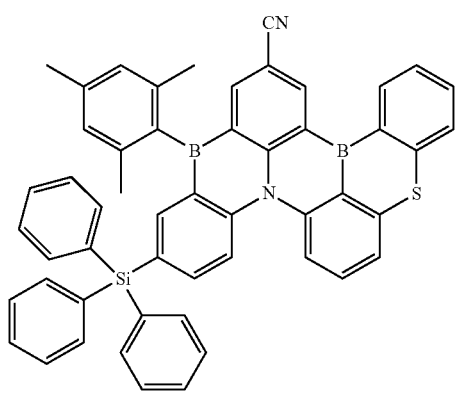
38
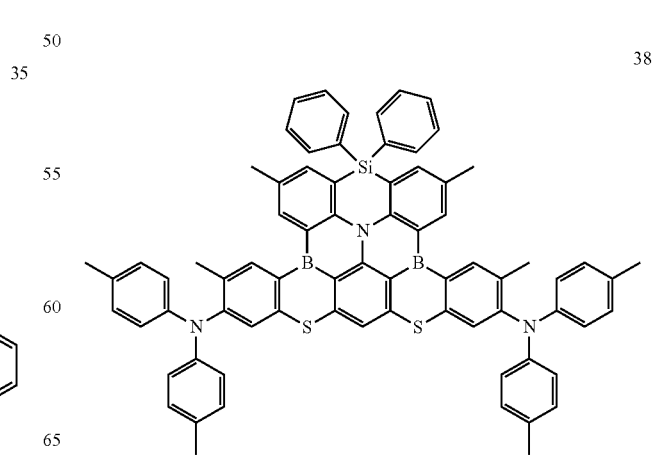

39
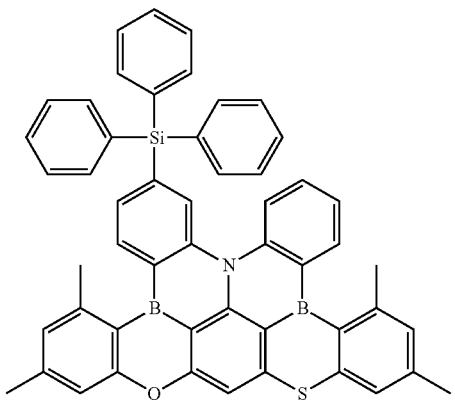
40
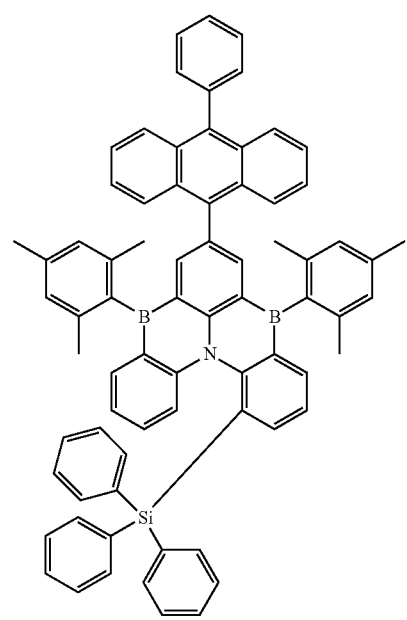
41
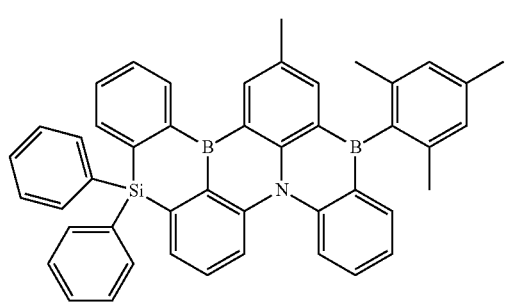
42
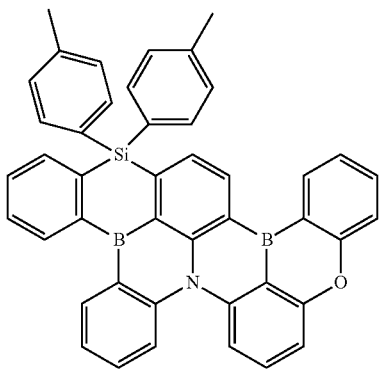
43
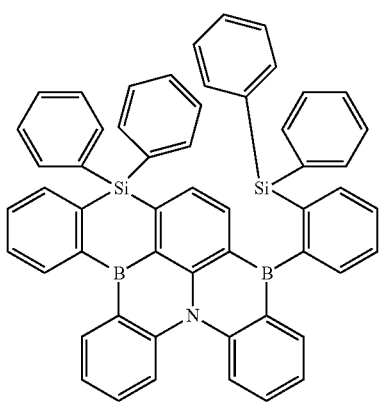
44
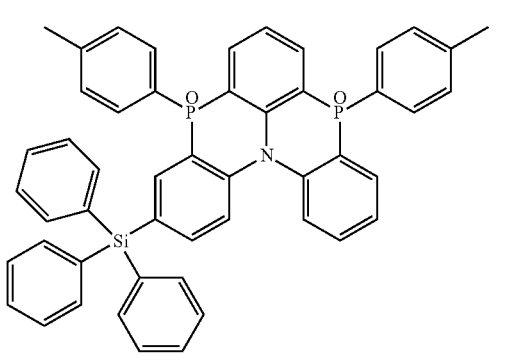
45

46
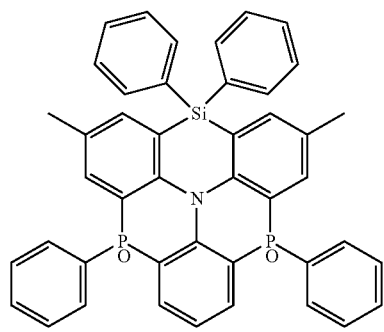
47
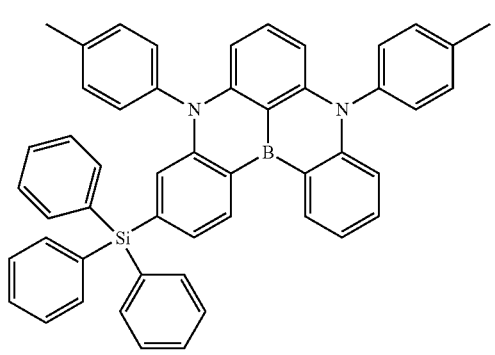
48
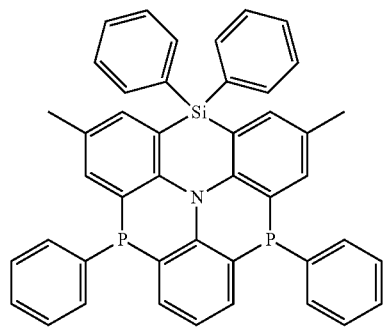
49
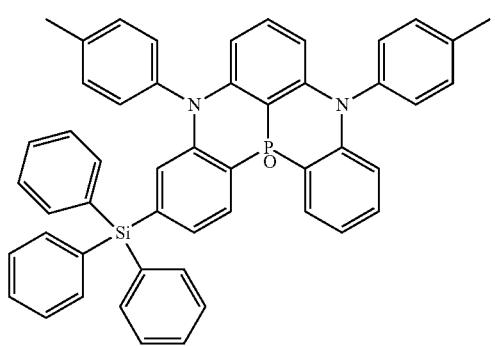
50
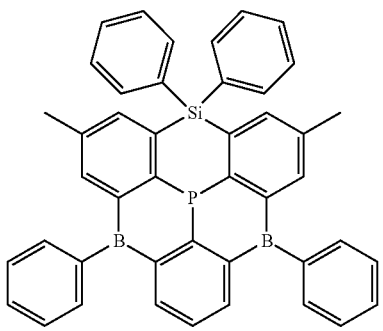
51
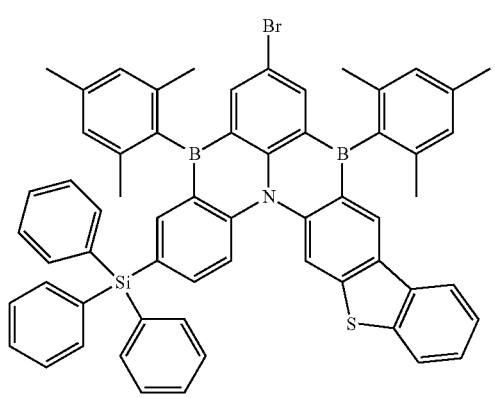
52
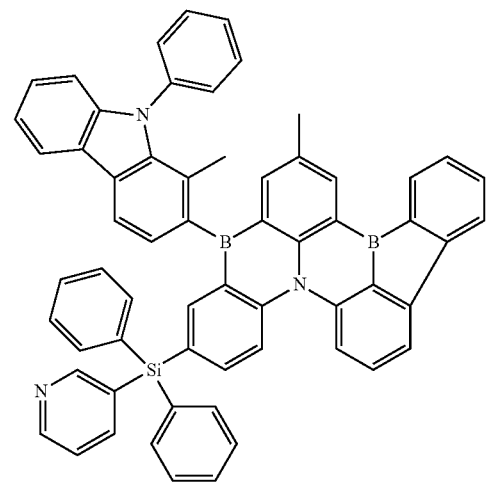

53
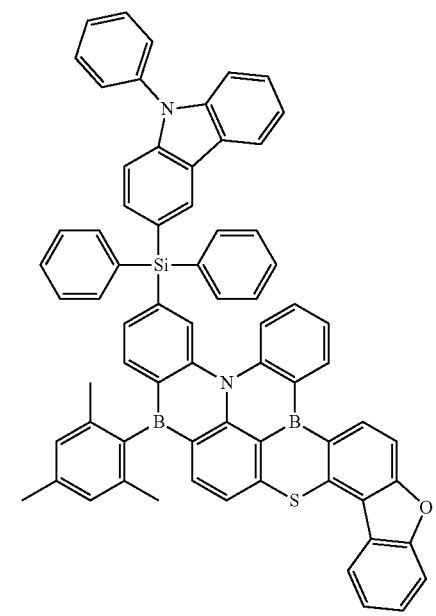
54
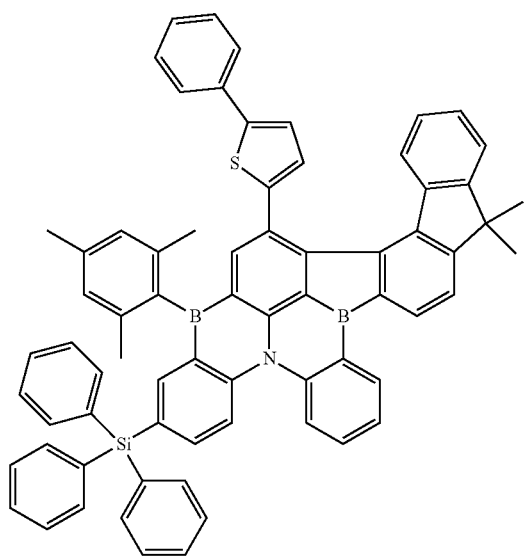
55
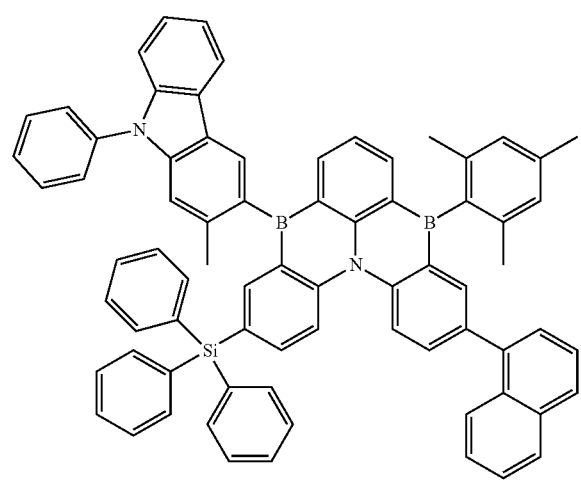
56
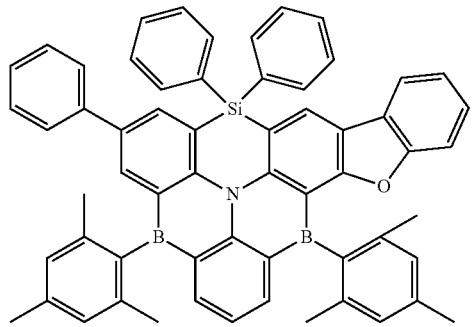
57
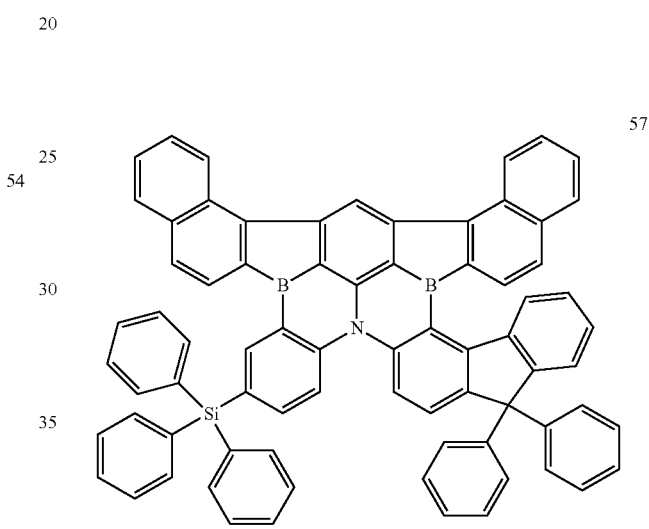
58
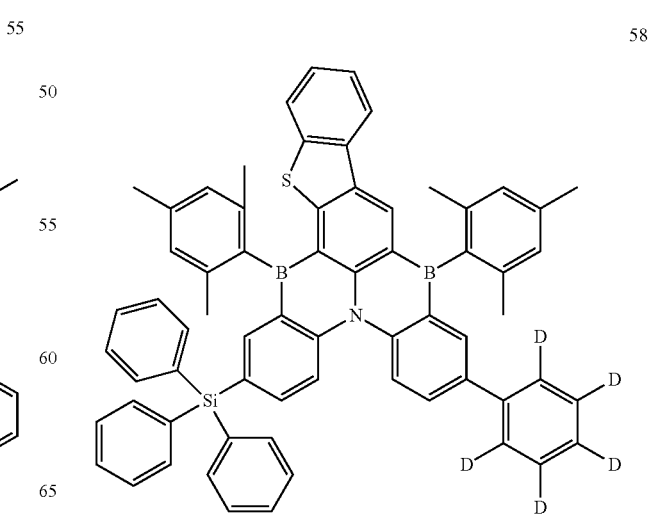

33
-continued
59
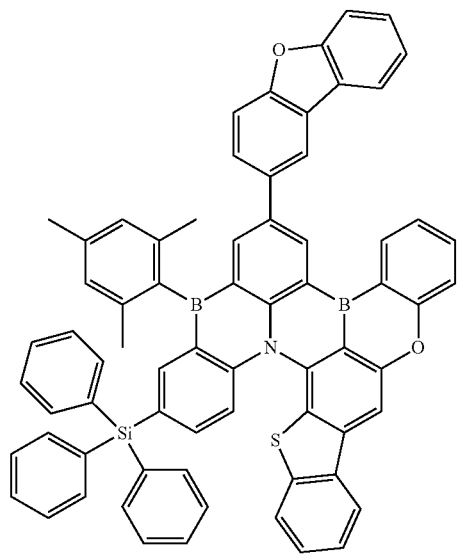
60
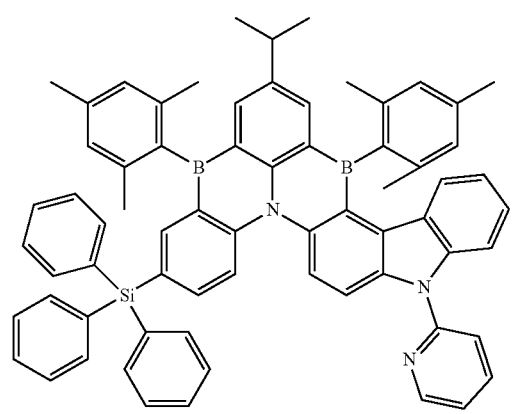
61
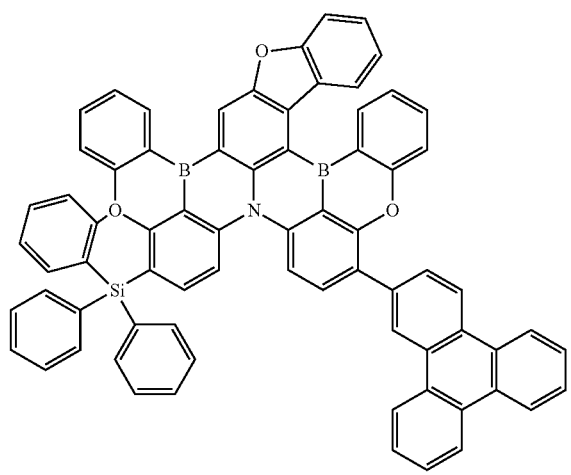
34
-continued
62
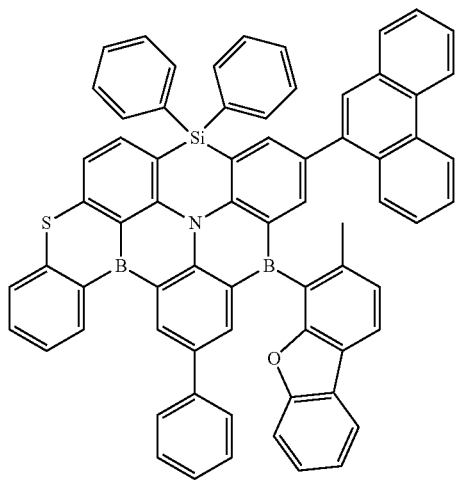
63
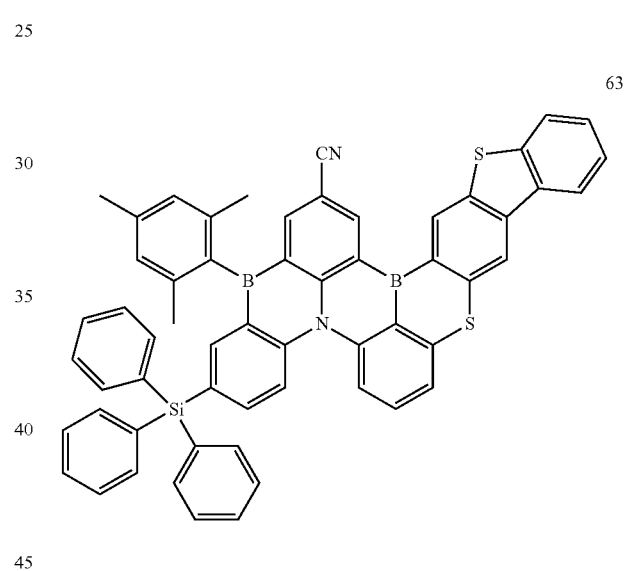
64
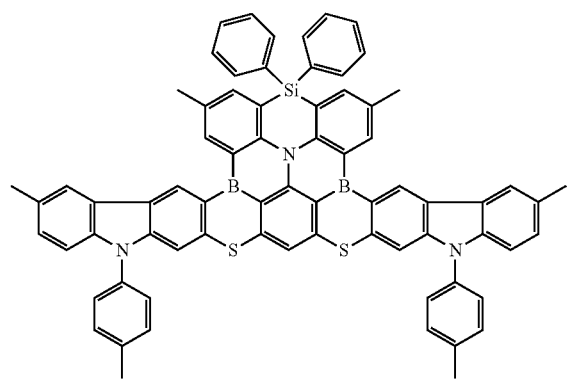

65
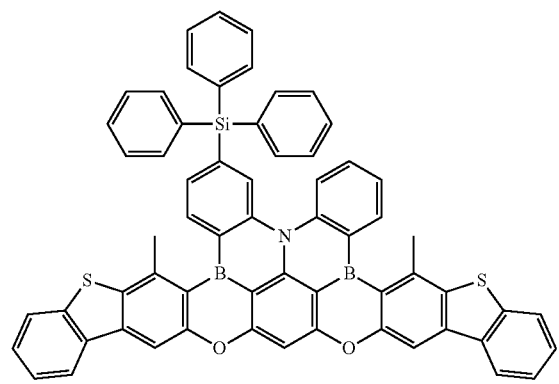
66
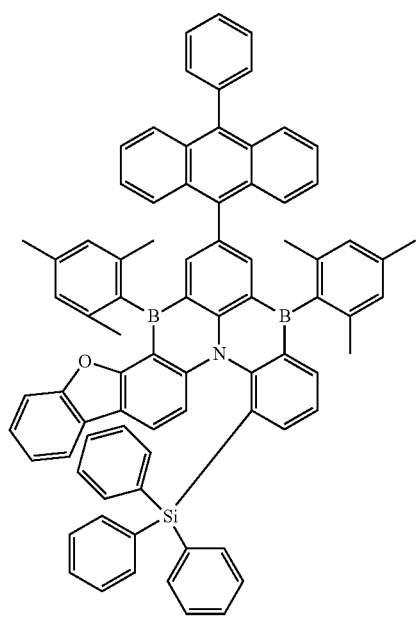
67
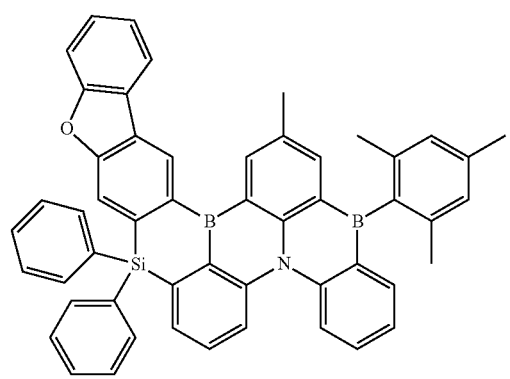
68
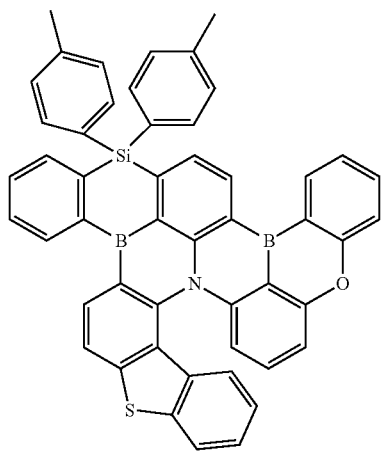
69
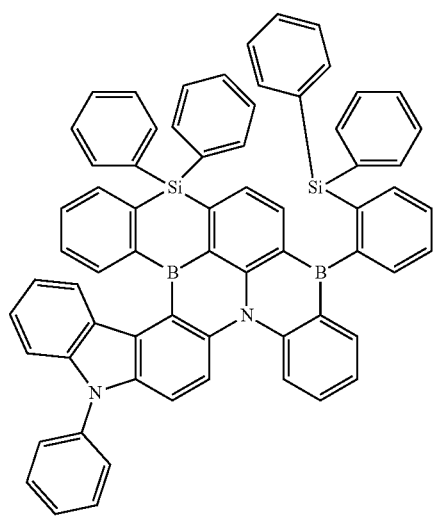
70
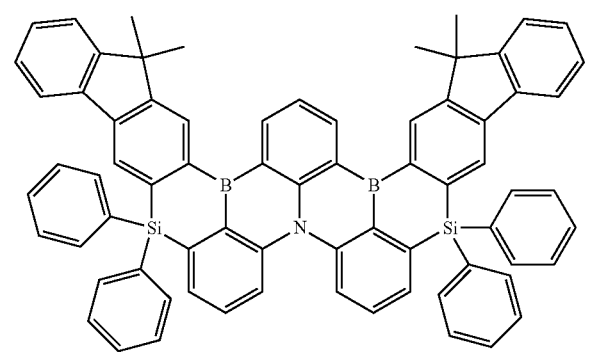

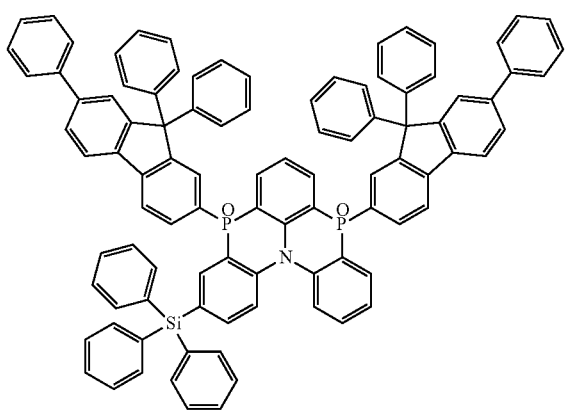

71

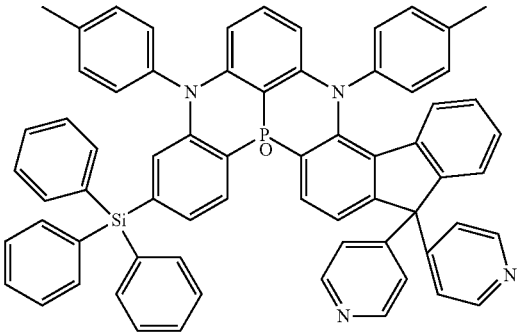

75

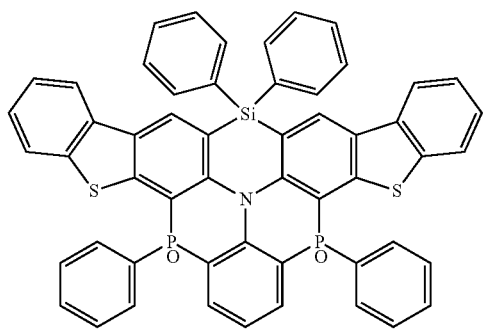

72

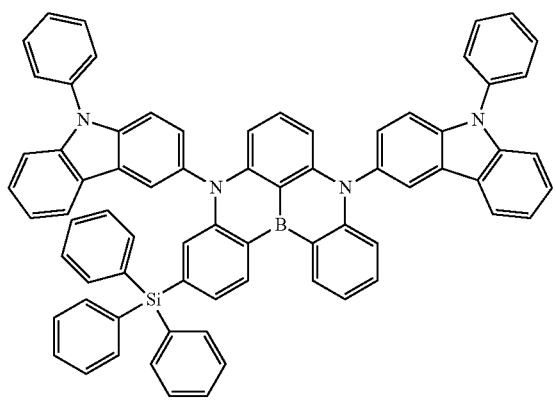

73

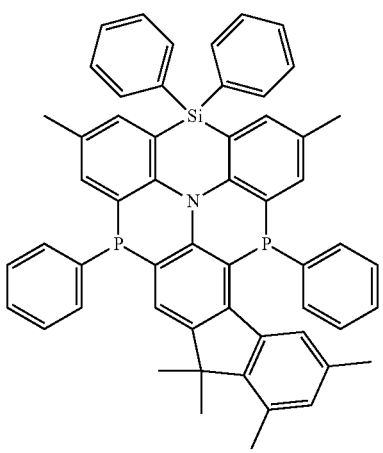

74

76

The polycyclic compound represented by Formula 1 is used in the organic electroluminescence device 10 of an embodiment and may improve the efficiency and life of the organic electroluminescence device. For example, the polycyclic compound represented by Formula 1 may be used in the emission layer EML of the organic electroluminescence device 10 of an embodiment and may improve the emission efficiency and life of the organic electroluminescence device.

In an embodiment, the emission layer EML includes a host and a dopant, and the host may be a host configured to emit delayed fluorescence and the dopant may be a dopant configured to emit delayed fluorescence. Meanwhile, the polycyclic compound of an embodiment, represented by Formula 1 may be included as a dopant material of an emission layer EML. For example, the polycyclic compound of an embodiment, represented by Formula 1 may be used as a TADF dopant.

Meanwhile, in an embodiment, the emission layer EML may include a known host material. For example, in an embodiment, the emission layer EML may include as a host material, tris(8-hydroxyquinolinato)aluminum ($Alq_3$), 4,4'-bis(N-carbazolyl)-1,1'-biphenyl (CBP), 3,3'-bis(N-carbazolyl)-1,1'-biphenyl(mCBP), poly(N-vinylcarbazole) (PVK), 9,10-di(naphthalene-2-yl) anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl) anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzofuran (PPF), etc. However, embodiments of the present disclosure are not limited thereto. Any suitable host materials configured to emit delayed fluorescence available in the art, in addition to the described host materials, may be included.

In the organic electroluminescence device 10 of an embodiment, the emission layer EML may further include any suitable dopant material available in the art. In an embodiment, the emission layer EML may include as a dopant, styryl derivatives (for example, 1,4-bis[2-(3-N-ethylcarbazolyl) vinyl]benzene (BCzVB), 4-(di-p-tolylamino)-4'-[(di-p-tolylamino) styryl]stilbene (DPAVB), and N-(4-((E)-2-(6-((E)-4-(diphenylamino) styryl) naphthalen-2-yl) vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N, N-diphenylamino) pyrene), etc.

Referring to FIGS. 1 to 3 again, in the organic electroluminescence device 10 of an embodiment, the electron transport region ETR is provided on the emission layer EML. The electron transport region ETR may include at least one selected from a hole blocking layer, an electron transport layer ETL and an electron injection layer EIL. However, embodiments of the present disclosure are not limited thereto.

The electron transport region ETR may have a single layer formed using a single material, a single layer formed using a plurality of different materials, or a multilayer structure having a plurality of layers formed using the same or a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure laminated from the first electrode EL1 of electron transport layer ETL/electron injection layer EIL, or hole blocking layer/electron transport layer ETL/electron injection layer EIL, without limitation. The thickness of the electron transport region ETR may be, for example, from about 100 Å to about 1,500 Å.

The electron transport region ETR may be formed using various suitable methods such as, for example, a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include, for example, tris(8-hydroxyquinolinato)aluminum (Alq$_3$), 1,3,5-tri[(3-pyridyl)-phen-3-yl]benzene, 2,4,6-tris (3'-(pyridin-3-yl) biphenyl-3-yl)-1,3,5-triazine, 2-(4-(N-phenylbenzoimidazol-1-yl)phenyl)-9,10-dinaphthylanthracene, 1,3,5-tri (1-phenyl-1H-benzo[d]imidazol-2-yl) benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2, 4-triazole (TAZ), 4-(naphthalen-1-yl)-3,5-diphenyl-4H-1,2, 4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di (naphthalene-2-yl) anthracene (ADN), or a mixture thereof, without limitation.

If the electron transport region ETR includes the electron transport layer ETL, the thickness of the electron transport layer ETL may be from about 100 Å to about 1,000 Å and may be, for example, from about 150 Å to about 500 Å. If the thickness of the electron transport layer ETL satisfies the above-described range, suitable or satisfactory electron transport properties may be obtained without substantial increase of a driving voltage.

If the electron transport region ETR includes the electron injection layer EIL, the electron transport region ETR may include, for example, LiF, lithium quinolate (LiQ), Li2O, BaO, NaCl, CsF, a metal in lanthanides such as Yb, and/or a metal halide such as RbCI, Rbl, and/or Kl. However, embodiments of the present disclosure are not limited thereto. The electron injection layer EIL also may be formed using a mixture material of an electron transport material and an insulating organo metal salt (e.g., an organometallic salt). The organo metal salt may be a material having an energy band gap of about 4 eV or more. In some embodiments, the organo metal salt may include, for example, metal acetates, metal benzoates, metal acetoacetates, metal acetylacetonates, and/or metal stearates.

If the electron transport region ETR includes the electron injection layer EIL, the thickness of the electron injection layer EIL may be from about 1 Å to about 100 Å, and from about 3 Å to about 90 Å. If the thickness of the electron injection layer EIL satisfies the above described range, suitable or satisfactory electron injection properties may be obtained without inducing substantial increase of a driving voltage.

The electron transport region ETR may include a hole blocking layer as described above. The hole blocking layer may include, for example, at least one selected from 2,9-dimethyl-4,7-diphenyl-1,10-phenanthroline (BCP), or 4,7-diphenyl-1,10-phenanthroline (Bphen). However, embodiments of the present disclosure are not limited thereto.

The second electrode EL2 is provided on the electron transport region ETR. The second electrode EL2 has conductivity (e.g., is electrically conductive). The second electrode EL2 may be formed using a metal alloy or a conductive compound. The second electrode EL2 may be a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, and/or the like.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, and/or the like.

In some embodiments, the second electrode EL2 may be coupled with an auxiliary electrode. If the second electrode EL2 is coupled with the auxiliary electrode, the resistance of the second electrode EL2 may decrease.

In the organic electroluminescence device 10, according to the application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. The electrons and the holes are recombined in the emission layer EML to produce excitons, and the excitons may emit light via transition from an excited state to a ground state.

If the organic electroluminescence device 10 is a top emission type, the first electrode EL1 may be a reflective electrode and the second electrode EL2 may be a transmissive electrode or a transflective electrode. If the organic electroluminescence device 10 is a bottom emission type, the first electrode EL1 may be a transmissive electrode or a transflective electrode and the second electrode EL2 may be a reflective electrode.

The organic electroluminescence device 10 of an embodiment of the present disclosure uses the polycyclic compound as a material for an emission layer and may have improved emission efficiency and life characteristics.

An embodiment of the present disclosure provides a polycyclic compound represented by the following Formula 1:

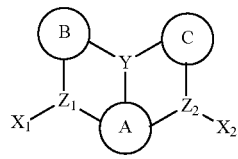

Formula 1

In Formula 1, Y is B, P, N, or P=O, in a case where Y is B or P=O, $Z_1$ and $Z_2$ are each independently N or P, and in a case where Y is N or P, $Z_1$ and $Z_2$ are each independently B or P=O.

In Formula 1, ring A to ring C are each independently a substituted or unsubstituted aryl ring having 6 to 30 carbon atoms that form a ring, or a substituted or unsubstituted heteroaryl ring having 2 to 30 carbon atoms that form a ring.

In Formula 1, $X_1$ and $X_2$ are each independently a substituted or unsubstituted aryl group having 6 to 30 carbon atoms that form a ring, or a substituted or unsubstituted heteroaryl group having 2 to 30 carbon atoms that form a ring.

In Formula 1, at least one substituent combined with ring A to ring C, $X_1$ and $X_2$ is —Si(Ra)$_3$ or —Si(Ra)$_2$—, and Ra is a substituted or unsubstituted aryl group having 6 to 30 carbon atoms that form a ring, or a substituted or unsubstituted heteroaryl group having 2 to 30 carbon atoms that form a ring. If at least one substituent bonded to at least one selected from ring A to ring C, $X_1$, and $X_2$ is —Si(Ra)$_2$—, the substituent may be combined with an adjacent group to form a ring.

In an embodiment, in Formula 1, the substituted or unsubstituted substituent selected from ring A to ring C, $X_1$, and $X_2$ may be a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or may be combined with an adjacent group to form a ring.

In an embodiment, in Formula 1, $Z_1$ and $Z_2$ in Formula 1 may be the same.

In an embodiment, in Formula 1, Y may be N, and $Z_1$ and $Z_2$ may be each independently B.

In an embodiment, Formula 1 may be represented by the following Formula 2:

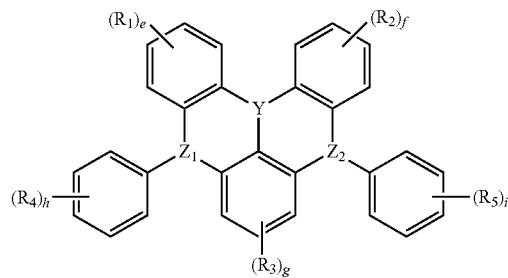

Formula 2

In Formula 2, $R_1$ to $R_5$ may be each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or may be combined with an adjacent group to form a ring.

In Formula 2, at least one among $R_1$ to $R_5$ may be —Si(Ra)$_3$, or at least one pair among $R_1$ and $R_2$, $R_2$ and $R_5$, $R_5$ and $R_3$, $R_3$ and $R_4$, and $R_1$ and $R_4$ may be —Si(Ra)$_2$—. In a case where at least one pair among $R_1$ and $R_2$, $R_2$ and $R_5$, $R_5$ and $R_3$, $R_3$ and $R_4$, and $R_1$ and $R_4$ is —Si(Ra)$_2$—, a ring may be formed.

In Formula 2, "e" and "f" may be each independently an integer of 0 to 4. Meanwhile, if "e" is 2 or more, a plurality of $R_1$ groups are the same or different, and if "f" is 2 or more, a plurality of $R_2$ groups are the same or different.

In Formula 2, "g" is an integer of 0 to 3. Meanwhile, if "g" is 2 or more, a plurality of $R_3$ groups are the same or different.

In Formula 2, "h" and "i" are each independently an integer of 0 to 5. Meanwhile, if "h" is 2 or more, a plurality of $R_4$ groups are the same or different, and if "i" is 2 or more, a plurality of $R_5$ groups are the same or different.

In Formula 2, Y, $Z_1$, $Z_2$ and Ra are the same as defined in Formula 1.

In addition, the same explanation on the polycyclic compound in the organic electroluminescence device of an embodiment may be applied to the polycyclic compound of an embodiment, represented by Formula 1 and Formula 2.

The polycyclic compound according to an embodiment may be any one selected from the compounds represented in Compound Group 1 above.

Hereinafter, the subject matter of the present disclosure will be explained with reference to examples and comparative examples. The following embodiments are only illustrations to assist the understanding of the present disclosure, and the scope of the present disclosure is not limited thereto.

EXAMPLES

1. Synthesis of Polycyclic Compounds

First, the synthetic method of the polycyclic compounds according to exemplary embodiments of the present disclosure will be explained with reference to the synthetic methods of Compound 6, Compound 9, Compound 11, and Compound 13. In addition, the synthetic methods of the polycyclic compounds explained below are only embodiments, and the synthetic method of the polycyclic compound according to embodiments of the present disclosure is not limited thereto.

Synthesis of Compound 6

The polycyclic compound according to an embodiment, Compound 6, may be synthesized as follows.

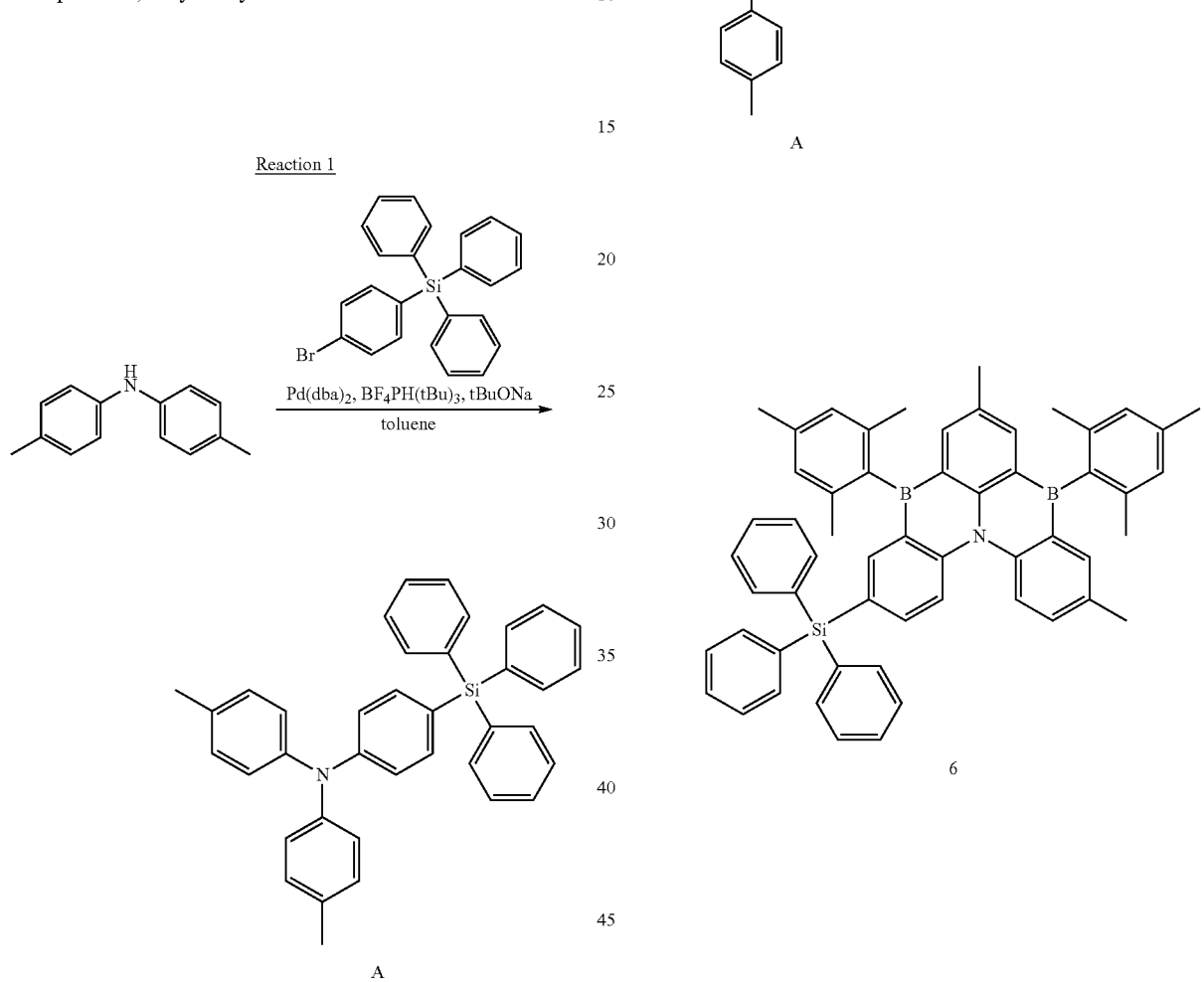

Ditolylamine (5.00 g, 25 mmol), (4-bromophenyl)triphenylsilane (12.63 g, 30 mmol), Pd(dba)₂ (0.46 g, 0.50 mmol), BF₄PH(tBu)₃ (0.59 g, 2.0 mmol), NaOtBu (3.05 g, 32 mmol), and 130 ml of toluene were stirred under an Ar atmosphere at about 80° C. for about 4 hours, followed by filtering through a pad of silica gel using a toluene solvent. The reaction solution thus obtained was concentrated, and silica gel column chromatography (eluent: hexane and toluene) was performed. Then, recrystallization was performed using a mixture solvent of hexane and toluene to obtain 11.45 g of a white solid in 83% yield. The molecular weight of the compound thus obtained was measured by fast atom bombardment-mass spectrometry (FAB-MS) and was found to be 532, and the compound was identified as Target Compound A.

Compound A (1.20 g, 2.3 mmol), triphenylborane (4.37 g, 18 mmol), and 25 ml of o-dichlorobenzene (ODCB) were stirred under an Ar atmosphere. Borontriiodide (7.10 g, 18 mmol) was added thereto, followed by heating and stirring at about 180° C. for about 8 hours. Then, the resultant product was cooled to room temperature, and a THF solution of mesityl Grignard reagent (1.0 M, 24 ml, 28.8 mmol) was added thereto. After stirring at room temperature for 1 hour, heating and stirring at about 60° C. was performed for about 3 hours. The reaction solution was extracted with toluene and dried with MgSO₄, and silica gel column chromatography (eluent: hexane and toluene) was performed. Then, recrystallization was performed using a mixture solvent of hexane and toluene to obtain 0.94 g of a yellow solid in 53% yield. The molecular weight of the compound thus obtained was measured by FAB-MS and was found to be 787, and the compound was identified as Target Compound 6.

Synthesis of Compound 9

The polycyclic compound according to an embodiment, Compound 9, may be synthesized as follows.

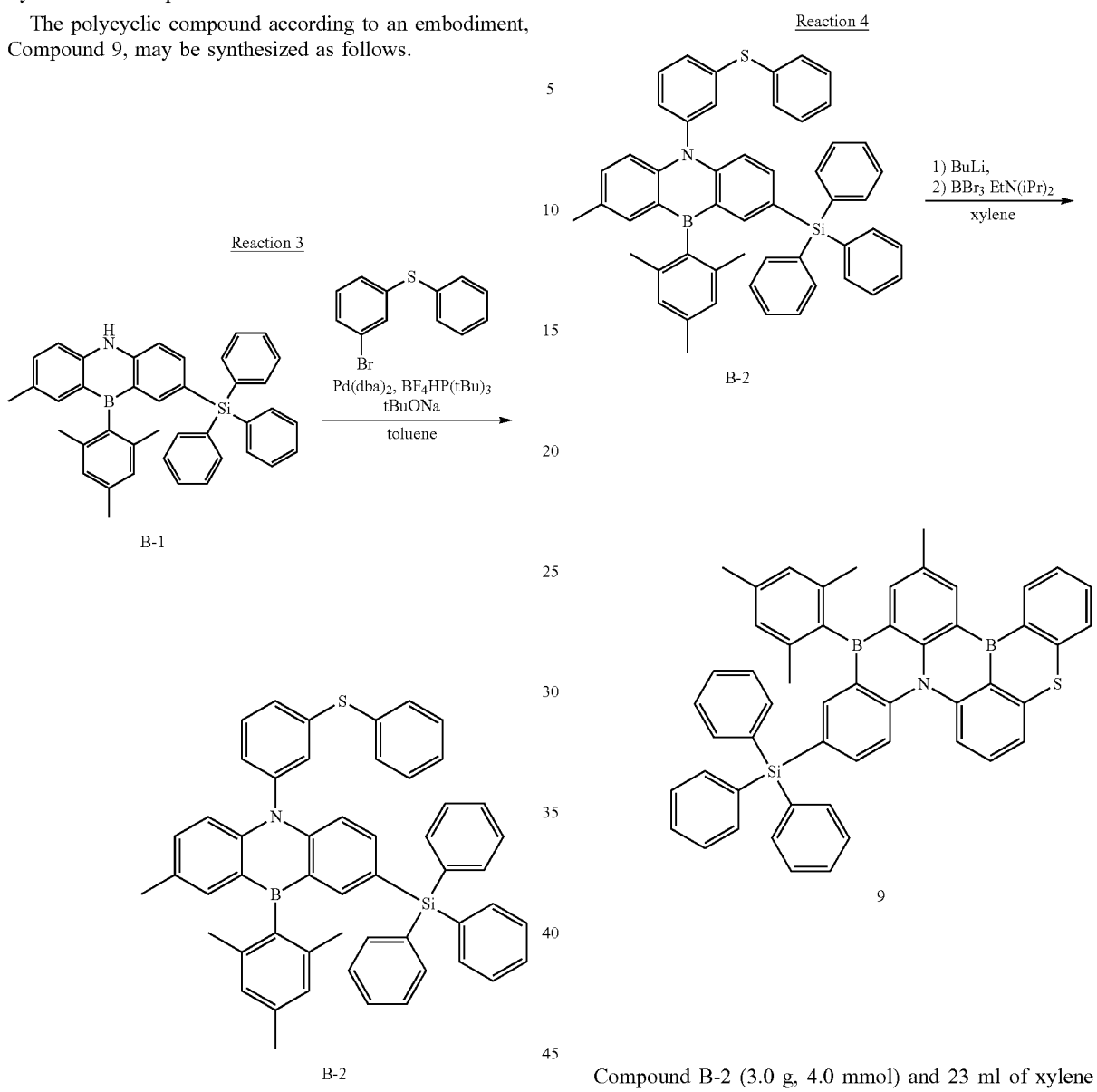

Compound B-1 (4.00 g, 7.0 mmol), (3-bromophenyl)phenylsulfane (2.23 g, 8.4 mmol), Pd(dba)$_2$ (0.13 g, 0.14 mmol), BF$_4$PH(tBu)$_3$ (0.16 g, 0.56 mmol), NaOtBu (0.84 g, 32 mmol), and 35 ml of toluene were stirred under an Ar atmosphere at about 80° C. for about 4 hours, followed by filtering through a pad of silica gel using a toluene solvent. The reaction solution thus obtained was concentrated, and silica gel column chromatography (eluent: hexane and toluene) was performed. Then, recrystallization was performed using a mixture solvent of hexane and toluene to obtain 4.08 g of a white solid in 77% yield. The molecular weight of the compound thus obtained was measured by FAB-MS and was found to be 754, and the compound was identified as Target Compound B-2.

Compound B-2 (3.0 g, 4.0 mmol) and 23 ml of xylene were stirred under an Ar atmosphere, followed by cooling to about 0° C. BuLi (1.6 M, 2.8 ml, 4.4 mmol) was slowly added thereto, followed by stirring at room temperature for about 30 minutes, heating and stirring at about 100° C. for about 3 hours, and cooling to about −20° C. A BBr$_3$ heptane solution (1.0 M, 5.2 ml, 5.2 mmol) was slowly added thereto, followed by stirring at room temperature for about 1 hour, and cooling to about 0° C. Diisopropylethylamine (EtN(iPr)$_2$, 1.4 ml, 8.0 mmol) was added thereto, followed by stirring at about 120° C. for about 12 hours, and cooling to room temperature. Then, an organic layer was extracted from the reaction solution with toluene, and the organic layer thus extracted was dried with MgSO$_4$ and concentrated under a reduced pressure. Silica gel column chromatography (eluent: hexane and toluene) was performed. Then, recrystallization was performed using a mixture solvent of hexane and toluene to obtain 1.4 g of a yellow solid in 60% yield. The molecular weight of the compound thus obtained was measured by FAB-MS and was found to be 762, and the compound was identified as Target Compound 9.

Synthesis of Compound 11

The polycyclic compound according to an embodiment, Compound 11, may be synthesized as follows.

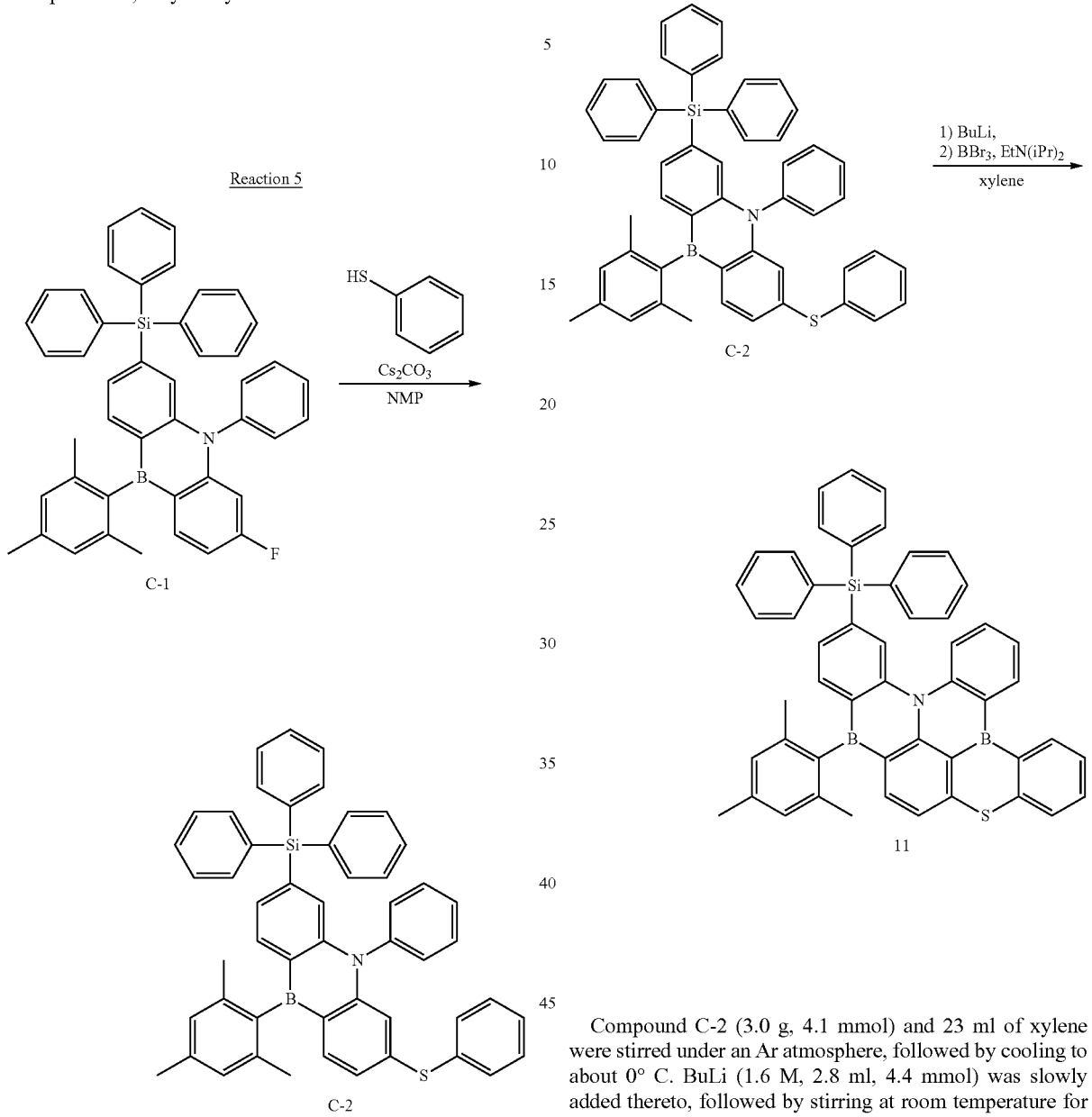

Compound C-1 (5.5 g, 8.5 mmol), benzenethiol (2.3 g, 21 mmol), Cs$_2$CO$_3$ (6.9 g, 21 mmol), and 28 ml of NMP were stirred under an Ar atmosphere at about 180° C. for about 20 hours, followed by filtering through a pad of silica gel using a toluene solvent. The reaction solution thus obtained was concentrated, and silica gel column chromatography (eluent: hexane and toluene) was performed. Then, recrystallization was performed using a mixture solvent of hexane and toluene to obtain 4.6 g of a white solid in 74% yield. The molecular weight of the compound thus obtained was measured by FAB-MS and was found to be 740, and the compound was identified as Target Compound C-2.

Compound C-2 (3.0 g, 4.1 mmol) and 23 ml of xylene were stirred under an Ar atmosphere, followed by cooling to about 0° C. BuLi (1.6 M, 2.8 ml, 4.4 mmol) was slowly added thereto, followed by stirring at room temperature for about 30 minutes, heating and stirring at about 100° C. for about 5 hours, and cooling to about −20° C. A BBr$_3$ heptane solution (1.0 M, 5.3 ml, 5.3 mmol) was slowly added thereto, followed by stirring at room temperature for about 1 hour, and cooling to about 0° C. Diisopropylethylamine (EtN(iPr)$_2$, 1.4 ml, 8.1 mmol) was added thereto, followed by stirring at about 120° C. for about 20 hours, and cooling to room temperature. Then, an organic layer was extracted from the reaction solution with toluene, and the organic layer thus extracted was dried with MgSO$_4$ and concentrated under a reduced pressure. Silica gel column chromatography (eluent: hexane and toluene) was performed. Then, recrystallization was performed using a mixture solvent of hexane and toluene to obtain 0.94 g of a yellow solid in 42% yield. The molecular weight of the compound thus obtained was measured by FAB-MS and was found to be 745, and the compound was identified as Target Compound 11.

Synthesis of Compound 13

The polycyclic compound according to an embodiment, Compound 13, may be synthesized as follows.

Reaction 7

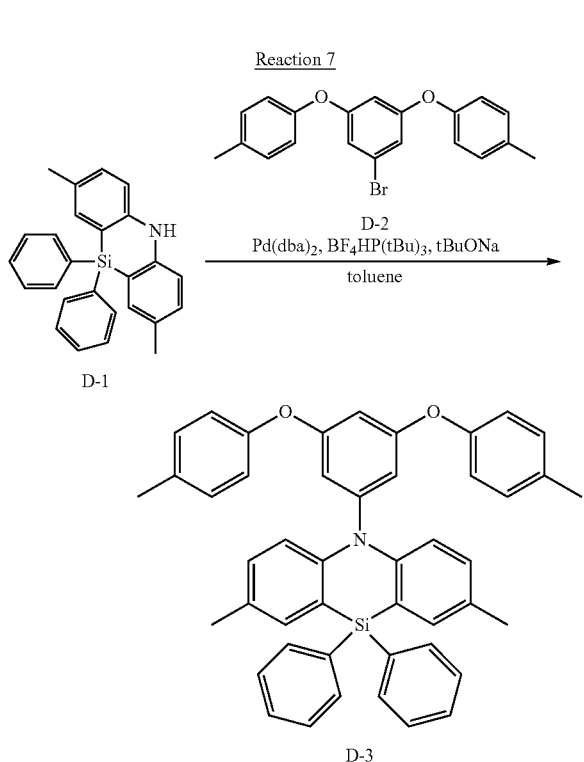

Compound D-1 (4.0 g, 11 mmol), Compound D-2 (4.3 g, 12 mmol), Pd (dba) 2 (0.19 g, 0.21 mmol), BF$_4$PH(tBu)$_3$ (0.25 g, 0.84 mmol), NaOtBu (1.3 g, 13 mmol), and 60 ml of toluene were stirred under an Ar atmosphere at about 80° C. for about 4 hours, followed by filtering through a pad of silica gel using a toluene solvent. The reaction solution thus obtained was concentrated, and silica gel column chromatography (eluent: hexane and toluene) was performed. Then, recrystallization was performed using a mixture solvent of hexane and toluene to obtain 5.6 g of a white solid in 80% yield. The molecular weight of the compound thus obtained was measured by FAB-MS and was found to be 666, and the compound was identified as Target Compound D-3.

Reaction 8

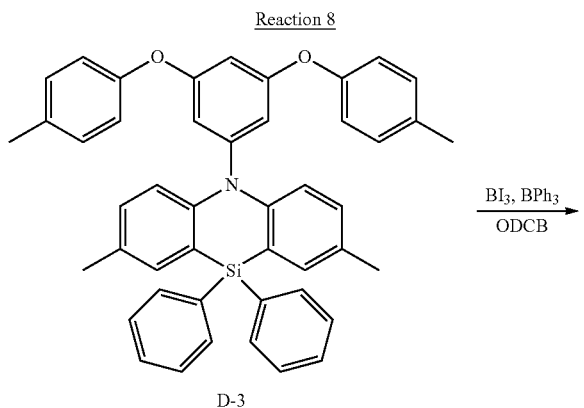

-continued

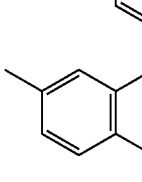

Compound D-3 (2.00 g, 3.0 mmol), triphenylborane (1.45 g, 6.0 mmol), and 30 ml of o-dichlorobenzene (ODCB) were stirred under an Ar atmosphere, and borontriiodide (5.90 g, 15 mmol) was added thereto, followed by heating and stirring at about 180° C. for about 24 hours. Then, the reaction solution was cooled to room temperature and a phosphate buffer was added. The resultant product was extracted with toluene, dried with MgSO$_4$, and filtered through pad of silica gel using a toluene solvent. Then, washing with ultrasonic wave was performed using a mixture solvent of hexane and toluene. Then, recrystallization was performed using toluene to obtain 1.57 g of a yellow solid in 77% yield. The molecular weight of the compound thus obtained was measured by FAB-MS and was found to be 681, and the compound was identified as Target Compound 13.

2. Manufacture and Evaluation of Organic Electroluminescence Device Including a Polycyclic Compound Manufacture of Organic Electroluminescence Device Organic electroluminescence devices of exemplary embodiments including the polycyclic compounds of exemplary embodiments in an emission layer were manufactured by a method described below. Organic electroluminescence devices of Examples 1 to 4 were manufactured using the polycyclic compounds of Compound 6, Compound 9, Compound 11, and Compound 13 as materials for an emission layer. Compounds used in the emission layer in Examples 1 to 4 and Comparative Examples 1 to 4 are shown below.

Table 1

TABLE 1

| Example Compounds |
|---|

TABLE 1-continued

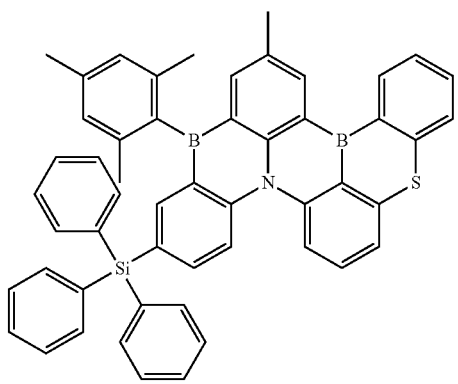 [SMILES: Cc1cc(C)c(B2c3cc([Si](c4ccccc4)(c4ccccc4)c4ccccc4)ccc3N3c4cccc5c4B(c4ccccc4S5)c4cc(C)cc2c43)c(C)c1]
9

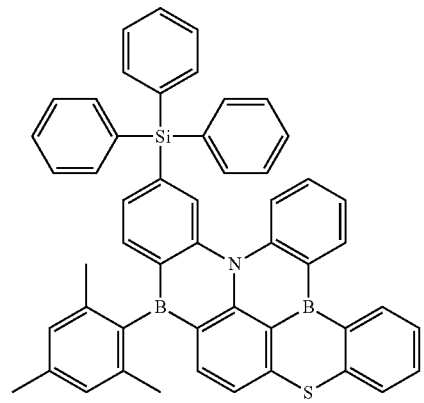 [SMILES: Cc1cc(C)c(B2c3ccc([Si](c4ccccc4)(c4ccccc4)c4ccccc4)cc3N3c4ccccc4B4c5ccccc5Sc5ccc2c3c54)c(C)c1]
11

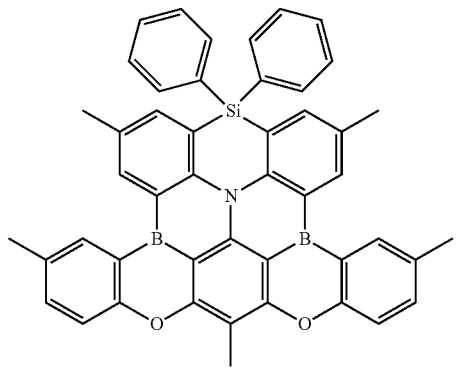
13

Comparative
Compounds

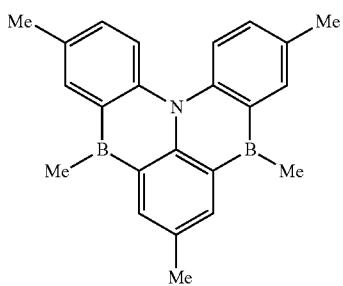 [SMILES: CB1c2cc(C)ccc2N2c3ccc(C)cc3B(C)c3cc(C)cc1c32]
X-1

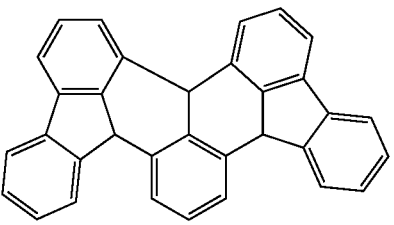 [SMILES: c1ccc2c(c1)-c1cccc3c1C2c1cccc2c1C3c1cccc3c1C2c1ccccc1-3]
X-2

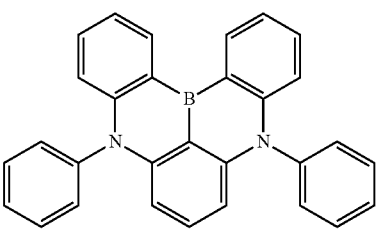 [SMILES: c1ccc(N2c3ccccc3B3c4ccccc4N(c4ccccc4)c4cccc2c43)cc1]
X-3

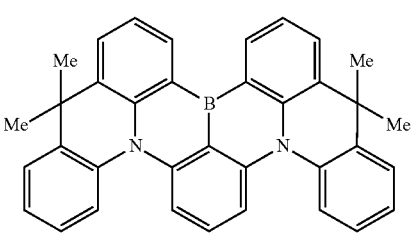 [SMILES: CC1(C)c2ccccc2N2c3cccc4c3B(c3cccc1c32)c1cccc2c1N4c1ccccc1C2(C)C]
X-4

The organic electroluminescence devices of the Examples and the Comparative Examples were manufactured by a method described below.

On a glass substrate, ITO with a thickness of about 1,500 Å was patterned and washed with ultra-pure water, and a UV ozone treatment was conducted for about 10 minutes. Then, HAT-CN was deposited to a thickness of about 100 Å, a-NPD was deposited to a thickness of about 800 Å, and mCP was deposited to a thickness of about 50 Å to form a hole transport region.

Then, respective ones of the polycyclic compounds of embodiments and the Comparative Compounds, and mCBP were co-deposited to a ratio of 5:95 to form a layer to a thickness of about 200 Å. That is, in order to form the emission layer by the co-deposition, a respective one of Compounds 6, 9, 11 and 13 was mixed with mCBP and deposited in Examples 1 to 4, and a respective one of Comparative Compounds X-1, X-2, X-3, and X-4 was mixed with mCBP and deposited in Comparative Examples 1 to 4.

On the emission layer, a layer was formed using TPBi to a thickness of about 300 Å, and a layer was formed using LiF to a thickness of about 5 Å to form an electron transport region. Then, a second electrode was formed using aluminum (Al) to a thickness of about 1,000 Å.

In the examples, the hole transport region, the emission layer, the electron transport region and the second electrode were formed by using a vacuum deposition apparatus.

Evaluation of Properties of Organic Electroluminescence Device

In order to evaluate the properties of the organic electroluminescence devices of the Examples and the Comparative Examples, the maximum emission wavelength (nm), maximum external quantum yield (%), external quantum yield (%) at 1,000 cd/m$^2$, and half width of emitted light were evaluated. The measurement was conducted using a luminous brightness measurement apparatus, C9920-11 of HAMAMATSU Photonics Co.

TABLE 2

| Device | Emission layer dopant | Maximum emission wavelength (nm) | Maximum external quantum yield (%) | 1000 cd/m² external quantum efficiency (%) | Half width |
|---|---|---|---|---|---|
| Example 1 | Compound 6 | 478 | 12.3 | 6.5 | 27 |
| Example 2 | Compound 9 | 472 | 13.5 | 5.8 | 30 |
| Example 3 | Compound 11 | 468 | 14.5 | 6.8 | 30 |
| Example 4 | Compound 13 | 464 | 12.4 | 7.2 | 28 |
| Comparative Example 1 | Comparative Compound X-1 | 486 | 10.8 | 4.8 | 38 |
| Comparative Example 2 | Comparative Compound X-2 | 490 | 7.6 | 5.4 | 48 |
| Comparative Example 3 | Comparative Compound X-3 | 462 | 11.8 | 2.1 | 30 |
| Comparative Example 4 | Comparative Compound X-4 | 493 | 9.6 | 3.4 | 44 |

Referring to Table 2, the organic electroluminescence devices of Example 1 to Example 4, which used the polycyclic compounds of embodiments as dopant materials of an emission layer showed higher external quantum efficiency and smaller half width when compared with the organic electroluminescence devices of Comparative Example 1 to Comparative Example 4. In addition, it was found that the organic electroluminescence devices of Example 1 to Example 4, which used the polycyclic compounds of embodiments as dopant materials of an emission layer, showed an emission wavelength of about 470 nm or less and deep blue emission.

Referring to the results of Table 2, it was found that the Example Compounds showed high emission efficiency in a deep blue emission region, and may be used as a material for thermally activated delayed fluorescence with high efficiency.

The organic electroluminescence device of an embodiment includes the polycyclic compound of the embodiment in an emission layer and may accomplish deep blue light which has relatively short wavelength, and at the same time, may attain decreased emission half width and high emission efficiency.

When compared with Comparative Examples 1 to 4, the polycyclic compound of an embodiment includes an aryl silyl group or a hetero aryl silyl group, which has a large volume, as a substituent. Due to the silyl substituent having a large volume, the coagulation of a dopant in high concentration conditions may be suppressed or reduced, and thereby preventing or reducing the effect of the deactivation (or dissociation) of excitons and increasing the wavelength of emitted light due to intermolecular interaction. In addition, due to weak electron attracting properties of the aryl silyl group or the hetero aryl silyl group, the electron state of the dopant may change and the decrease of the wavelength of emission color and roll-off, which is a phenomenon that degrades emission efficiency under high luminance, may be restrained or reduced.

The organic electroluminescence device according to an embodiment of the present disclosure may attain high efficiency and long life.

The polycyclic compound according to an embodiment of the present disclosure may improve the life and efficiency of an organic electroluminescence device.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

What is claimed is:

1. An organic electroluminescence device, comprising:
a first electrode;
a hole transport region on the first electrode;
an emission layer on the hole transport region;
an electron transport region on the emission layer; and
a second electrode on the electron transport region,
wherein the first electrode and the second electrode each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, Zn, a compound of two or more thereof, a mixture of two or more thereof, and oxides thereof, and wherein the emission layer comprises a polycyclic compound represented by the following Formula 1:

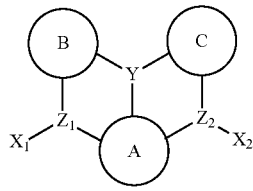

Formula 1 in Formula 1,

Y is P, or P=O, $Z_1$ and $Z_2$ are each independently B, ring A to ring C are each independently a substituted or unsubstituted aryl ring having 6 to 30 carbon atoms that form a ring, or a substituted or unsubstituted heteroaryl ring having 2 to 30 carbon atoms that form a ring, $X_1$ and $X_2$ are each independently a substituted or unsubstituted aryl group having 6 to 30 carbon atoms that form a ring, or a substituted or unsubstituted heteroaryl group having 2 to 30 carbon atoms that form a ring, at least one substituent bonded to at least one selected from ring A to ring C, $X_1$, and $X_2$ is —Si(Ra)$_3$ or —Si(Ra)$_2$—, and Ra is a substituted or unsubstituted aryl group having 6 to 30 carbon atoms that form a ring, or a substituted or unsubstituted heteroaryl group having 2 to 30 carbon atoms that form a ring, and wherein the polycyclic compound emits thermally activated delayed fluorescence.

2. The organic electroluminescence device of claim 1, wherein the emission layer is configured to emit delayed fluorescence.

3. The organic electroluminescence device of claim 1, wherein the emission layer is a delayed fluorescence emission layer comprising a host and a dopant, and the dopant comprises the polycyclic compound.

4. The organic electroluminescence device of claim 1, wherein the emission layer is a thermally activated delayed fluorescence emission layer configured to emit blue light.

5. The organic electroluminescence device of claim 1, wherein at least one bonded to at least one selected from ring A to ring C, $X_1$, and $X_2$ is each independently a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or is combined with an adjacent group to form a ring.

6. The organic electroluminescence device of claim 1, wherein Formula 1 is represented by the following Formula 2:

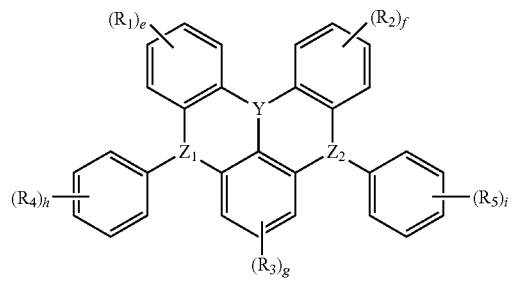

Formula 2 in Formula 2, $R_1$ to $R_5$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or combined with an adjacent group to form a ring, at least one among $R_1$ to $R_5$ is —Si(Ra)$_3$, or at least one pair among $R_1$ and $R_2$, $R_2$ and $R_5$, $R_5$ and $R_3$, $R_3$ and $R_4$, and $R_1$ and $R_4$ is —Si(Ra)$_2$—, e and f are each independently an integer of 0 to 4, g is an integer of 0 to 3, h and i are each independently an integer of 0 to 5, and Y, $Z_1$, $Z_2$ and Ra are the same as defined in Formula 1.

7. The organic electroluminescence device of claim 6, wherein Formula 2 is represented by any one among the following Formula 2-1 to Formula 2-3:

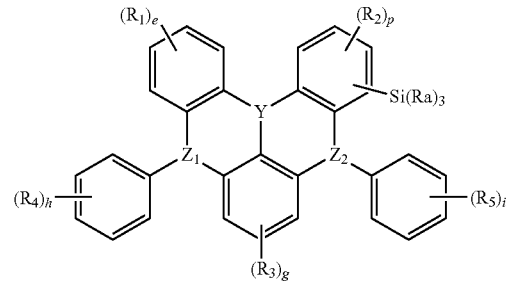

Formula 2-1

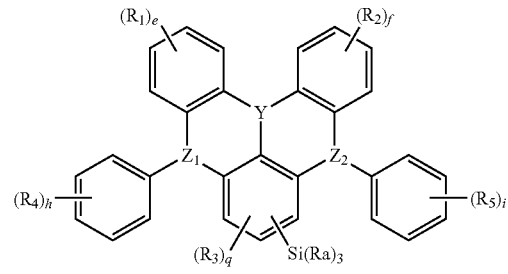

Formula 2-2

Formula 2-3

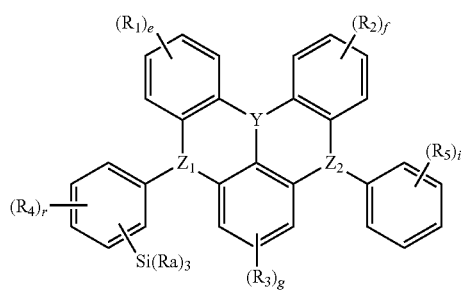

in Formula 2-1 to Formula 2-3,
p is an integer of 0 to 3,
q is an integer of 0 to 2,
r is an integer of 0 to 4, and
$R_1$ to $R_5$, Ra, and e to i are the same as defined in Formula 2.

8. The organic electroluminescence device of claim 1, wherein Formula 1 is represented by the following Formula 3:

Formula 3

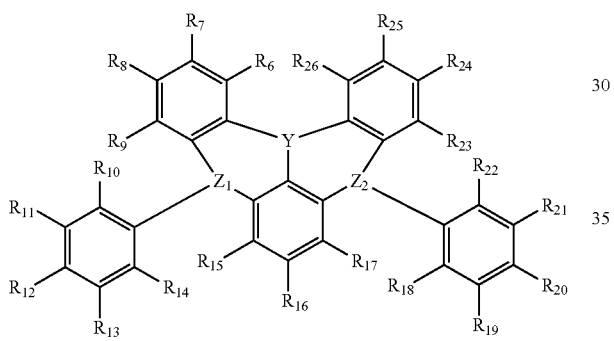

in Formula 3,
$R_6$ to $R_{26}$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or combined with an adjacent group to form a ring,
at least one among $R_6$ to $R_{26}$ is $-Si(Ra)_3$, or at least one pair among $R_6$ and $R_{26}$, $R_9$ and $R_{10}$, $R_{14}$ and $R_{15}$, $R_{17}$ and $R_{18}$, and $R_{22}$ and $R_{23}$ is $-Si(Ra)_2-$, and
Y, $Z_1$, $Z_2$ and Ra are the same as defined in Formula 1.

9. The organic electroluminescence device of claim 8, wherein at least one pair among $R_6$ and $R_7$, $R_7$ and $R_8$, $R_8$ and $R_9$, $R_{10}$ and $R_{11}$, $R_{11}$ and $R_{12}$, $R_{12}$ and $R_{13}$, $R_{13}$ and $R_{14}$, $R_{15}$ and $R_{16}$, $R_{16}$ and $R_{17}$, $R_{18}$ and $R_{19}$, $R_{19}$ and $R_{20}$, $R_{20}$ and $R_{21}$, $R_{21}$ and $R_{22}$, $R_{23}$ and $R_{24}$, $R_{24}$ and $R_{25}$, and $R_{25}$ and $R_{26}$ forms a condensed structure with any one among the following Formulae 3-1 to 3-4:

Formula 3-1

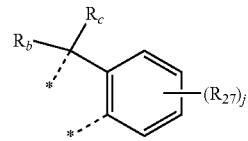

Formula 3-2

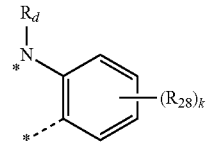

Formula 3-3

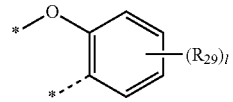

Formula 3-4

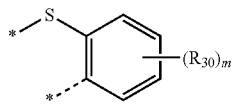

in Formulae 3-1 to 3-4,
$R_{27}$ to $R_{30}$, and Rb to Rd are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted aryl group having 6 to 30 carbon atoms that form a ring, or a substituted or unsubstituted heteroaryl group having 2 to 30 carbon atoms that form a ring, and
j to m are each independently an integer of 0 to 4.

10. The organic electroluminescence device of claim 8, wherein at least one among $R_6$ to $R_9$, $R_{10}$ to $R_{14}$, and $R_{15}$ to $R_{17}$ is $-Si(Ra)_3$.

11. The organic electroluminescence device of claim 1, wherein Formula 1 is any one among compounds represented in the following Compound Group 1:

Compound Group 1

50

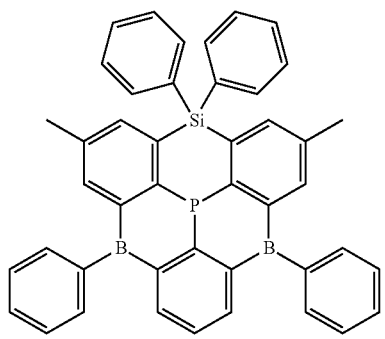

76

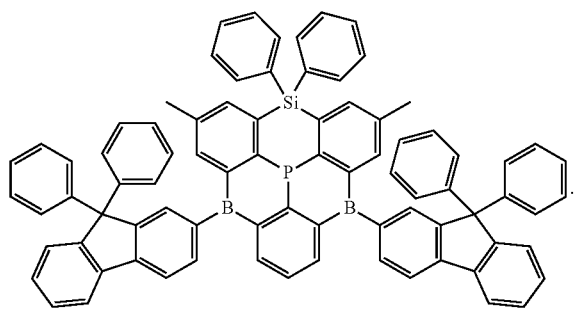

12. A polycyclic compound represented by the following Formula 1:

Formula 1

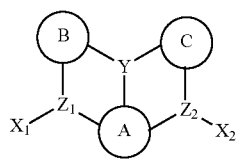

in Formula 1,

Y is P, or P=O, $Z_1$ and $Z_2$ are each independently B, ring A to ring C are each independently a substituted or unsubstituted aryl ring having 6 to 30 carbon atoms that form a ring, or a substituted or unsubstituted heteroaryl ring having 2 to 30 carbon atoms that form a ring, $X_1$ and $X_2$ are each independently a substituted or unsubstituted aryl group having 6 to 30 carbon atoms that form a ring, or a substituted or unsubstituted heteroaryl group having 2 to 30 carbon atoms that form a ring, at least one substituent bonded to at least one selected from ring A to ring C, $X_1$, and $X_2$ is —Si(Ra)$_3$ or —Si(Ra)$_2$—, and Ra is a substituted or unsubstituted aryl group having 6 to 30 carbon atoms that form a ring, or a substituted or unsubstituted heteroaryl group having 2 to 30 carbon atoms that form a ring, and wherein the polycyclic compound emits thermally activated delayed fluorescence.

13. The polycyclic compound of claim 12, wherein Formula 1 is represented by the following Formula 2:

Formula 2

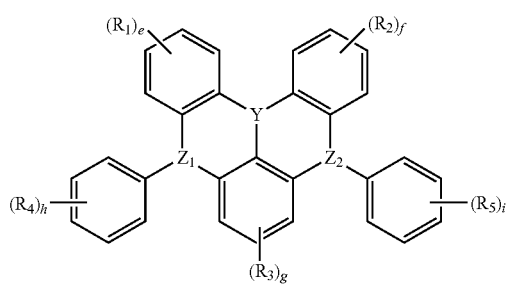

in Formula 2, $R_1$ to $R_5$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or combined with an adjacent group to form a ring, at least one among $R_1$ to $R_5$ is —Si(Ra)$_3$, or at least one pair among $R_1$ and $R_2$, $R_2$ and $R_5$, $R_5$ and $R_3$, $R_3$ and $R_4$, and $R_1$ and $R_4$ is —Si(Ra)$_2$—, e and f are each independently an integer of 0 to 4, g is an integer of 0 to 3, h and i are each independently an integer of 0 to 5, and Y, $Z_1$, $Z_2$ and Ra are the same as defined in Formula 1.

14. The polycyclic compound of claim 13, wherein Formula 2 is represented by any one among the following Formula 2-1 to Formula 2-3:

Formula 2-1

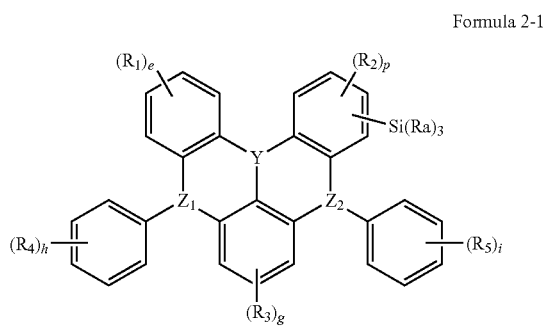

Formula 2-2

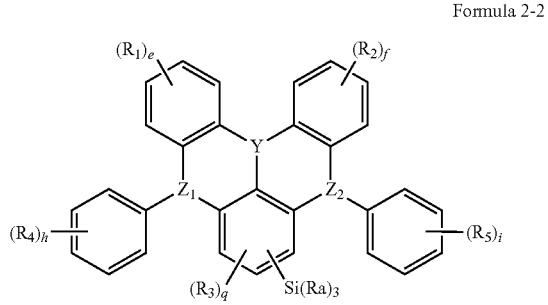

Formula 2-3

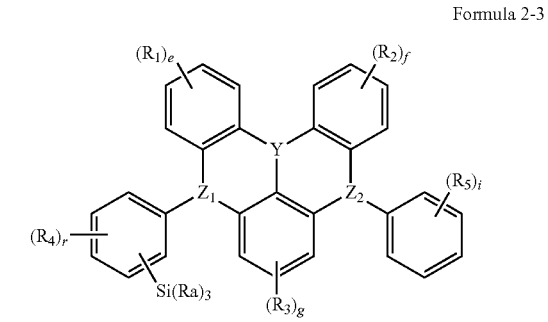

in Formula 2-1 to Formula 2-3,
p is an integer of 0 to 3,
q is an integer of 0 to 2,
r is an integer of 0 to 4, and
$R_1$ to $R_5$, Ra, and e to i are the same as defined in Formula 2.

15. The polycyclic compound of claim 12, wherein Formula 1 is represented by the following Formula 3:

Formula 3

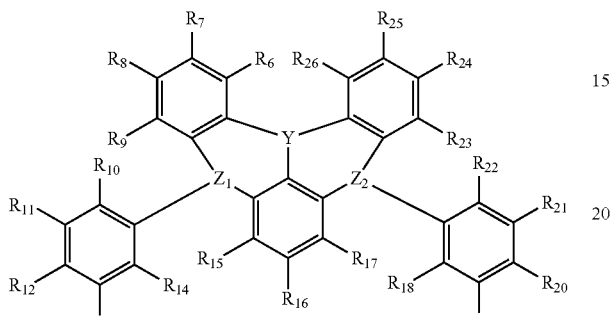

in Formula 3,
$R_6$ to $R_{26}$ are each independently a hydrogen atom, a deuterium atom, a halogen atom, a nitro group, a cyano group, a hydroxyl group, a substituted or unsubstituted amine group, a substituted or unsubstituted thiol group, a substituted or unsubstituted alkyl group having 1 to 20 carbon atoms, a substituted or unsubstituted alkoxy group having 1 to 20 carbon atoms, a substituted or unsubstituted aryl group having 6 to 30 carbon atoms that form a ring, a substituted or unsubstituted aryloxy group having 6 to 30 carbon atoms that form a ring, a substituted or unsubstituted heteroaryl group having 2 to 30 carbon atoms that form a ring, a substituted or unsubstituted aryl silyl group, or a substituted or unsubstituted hetero aryl silyl group, or combined with an adjacent group to form a ring,
at least one among $R_6$ to $R_{26}$ is —Si(Ra)$_3$, or at least one pair among $R_6$ and $R_{26}$, $R_9$ and $R_{10}$, $R_{14}$ and $R_{15}$, $R_{17}$ and $R_{18}$, and $R_{22}$ and $R_{23}$ is —Si(Ra)$_2$—, and
Y, $Z_1$, $Z_2$ and Ra are the same as defined in Formula 1.

16. The polycyclic compound of claim 12, wherein Formula 1 is any one among compounds represented in the following Compound Group 1:

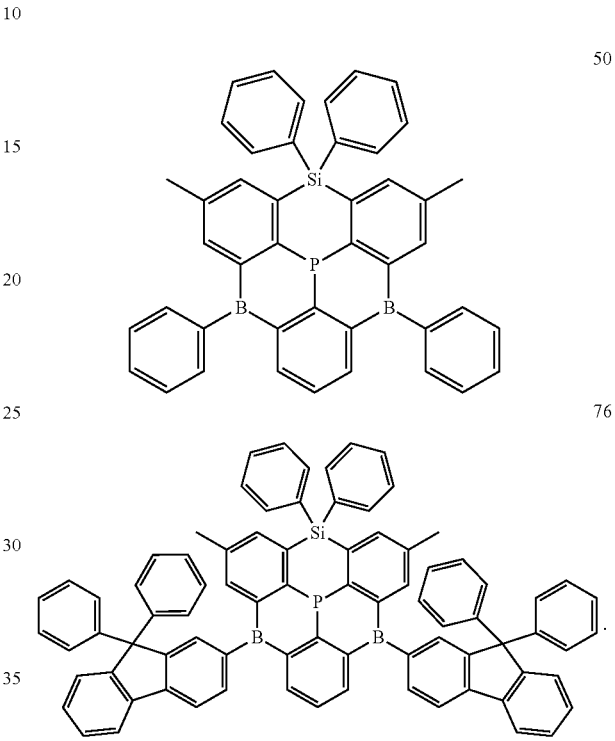

* * * * *